(12) United States Patent
Pendharkar et al.

(10) Patent No.: US 7,772,644 B2
(45) Date of Patent: Aug. 10, 2010

(54) VERTICAL DIFFUSED MOSFET

(75) Inventors: Sameer Pendharkar, Allen, TX (US);
Binghua Hu, Plano, TX (US)

(73) Assignee: Texas Instruments Incorporated,
Dallas, TX (US)

( * ) Notice: Subject to any disclaimer, the term of this patent is extended or adjusted under 35 U.S.C. 154(b) by 0 days.

(21) Appl. No.: 12/509,922

(22) Filed: Jul. 27, 2009

(65) Prior Publication Data

US 2009/0294841 A1 Dec. 3, 2009

Related U.S. Application Data

(62) Division of application No. 12/120,158, filed on May 13, 2008, now Pat. No. 7,732,863.

(51) Int. Cl.
*H01L 29/78* (2006.01)
(52) U.S. Cl. .................. 257/341; 257/E29.257
(58) Field of Classification Search .................. 257/328, 257/331, 321, 330, 341, E29.257; 438/234, 438/268, 286

See application file for complete search history.

(56) References Cited

OTHER PUBLICATIONS

Hu et al., "A Unique LDMOS Process Integration;" U.S. Utility Patent Application filed May 25, 2007; U.S. Appl. No. 11/753,789; Texas Instruments Incorporated.

*Primary Examiner*—Thomas L Dickey
*Assistant Examiner*—Nikolay Yushin
(74) *Attorney, Agent, or Firm*—Rose Alyssa Keagy; W. James Brady; Frederick J. Telecky, Jr.

(57) ABSTRACT

A LDMOS transistor having a channel region located between an outer boundary of an n-type region and an inner boundary of a p-body region. A width of the LDMOS channel region is less than 80% of a distance between an outer boundary of an $n^+$-type region and the inner boundary of a p-body region. Also, a method for making a LDMOS transistor where the n-type dopants are implanted at an angle that is greater than an angle used to implant the p-type dopants. Furthermore, a VDMOS having first and second channel regions located between an inner boundary of a first and second p-body region and an outer boundary of an n-type region of the first and second p-body regions. The width of the first and second channel regions of the VDMOS is less than 80% of a distance between the inner boundary of the first and second p-body regions and an outer boundary of an $n^+$-type region of the first and second p-body regions. Moreover, a method for making a VDMOS transistor where the n-type dopants are implanted at an angle that is greater than an angle used to implant the p-type dopants.

3 Claims, 42 Drawing Sheets

VERTICAL DIFFUSED MOSFET

CROSS-REFERENCE TO RELATED APPLICATIONS

This is a division of application Ser. No. 12/120,158, filed May 13, 2008, the entire disclosure of which is hereby incorporated by reference.

BACKGROUND OF THE INVENTION

This invention relates to a Laterally Diffused MOSFET ("LDMOS") or a Vertically Diffused MOSFET ("VDMOS") that is formed by using an angled n-type implant.

DETAILED DESCRIPTION OF THE INVENTION

Figure 1:
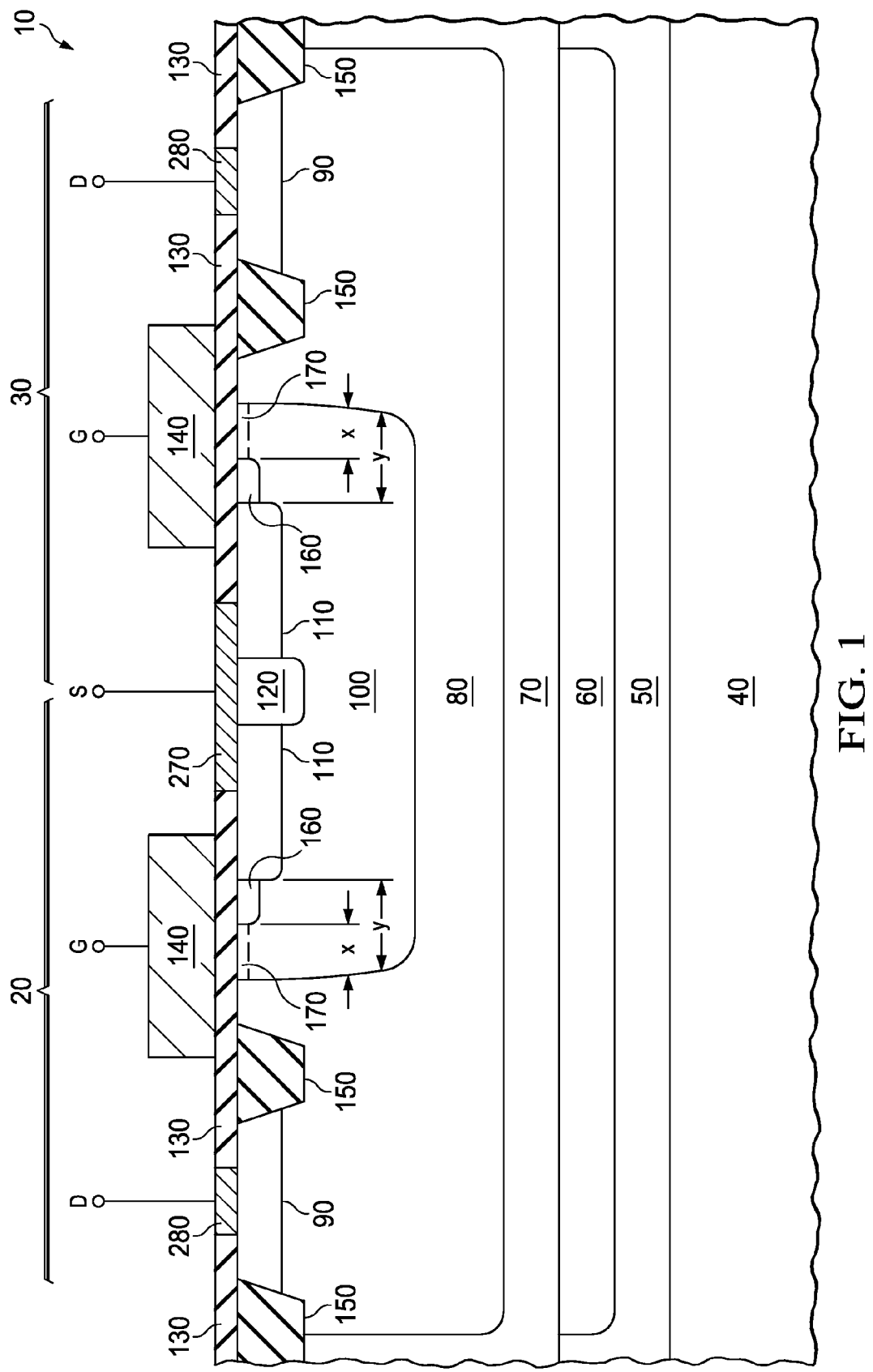
FIG. 1 is a cross-sectional view of a LDMOS in accordance with the present invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

This invention may be implemented in a Metal Oxide Semiconductor Field-Effect Transistor ("MOSFET") transistor. More specifically, this invention may be used for LDMOS or VDMOS transistors of the Drain Extended MOSFETS ("DEMOS") transistor family. Moreover, the LDMOS and VDMOS transistors of the present invention may be used in integrated circuits employing Complementary Metal Oxide Semiconductor—Diffusion Metal Oxide Semiconductor ("CMOS-DMOS") or Bipolar CMOS-DMOS ("BCD") technologies.

Referring to the drawings, FIG. 1 is a cross-sectional view of two LDMOS transistors 20, 30 in accordance with the present invention. In the example application, the two LDMOS transistors 20, 30 are formed within a semiconductor wafer 10 having a $p^+$-type substrate 40, a first $p^-$-type doped epitaxial layer 50 (that may contain an n-buried layer 60), and a second $p^-$-type epitaxial layer 70. The $p^-$-type epitaxial layer 70 has an $n^-$-type well ("n-well") 80 containing the two LDMOS transistors 20, 30.

The gate of LDMOS transistors 20, 30 is comprised of a gate dielectric 130 and a gate electrode 140. The source of LDMOS transistors 20, 30 (having a source contact 270) is a shared source that includes two $n^+$-type regions 110 plus a $p^+$-type region 120 that are formed within a p-body region 100. The drain of LDMOS transistors 20, 30 (having a drain contact 280) is an $n^+$-type drain 90 within the n-well 80. As shown in FIG. 1, the drain 90 is extended (i.e. laterally separated) from the gate electrode 140 by a portion of an isolation region 150. Additional isolation regions 150 that are formed within the $p^-$-type epitaxial layer 70 electrically insulate the two LDMOS transistors 20, 30 from other active devices located within the semiconductor wafer 10 (not shown). In the example application, the isolation regions 150 are shallow trench isolation ("STI") structures; however, any conventional isolation structures may be used such as field oxide regions ("FOX" or "LOCOS"), implanted isolation regions, or deposited isolation regions.

In accordance with the example embodiment, the p-body region 100 also includes n-type regions 160. Therefore, the channel region 170 of LDMOS transistors 20, 30 is located close to the surface of the p-body region 100 between an outer boundary of the n-type region 160 and an inner boundary of the p-body region 100, as shown in FIG. 1. The n-type regions 160 are formed with an angled implant that exceeds the implant angle that is used to form the p-body region 100, as described infra. As a result, the n-type regions 160 of the present invention decrease the width of the channel region 170 of the LDMOS transistors 20, 30. More specifically, the width "x" of the channel region 170 is 60-80% of the total width "y" of the surface of the p-body region 100 under the gate electrode 140 between an outer boundary of $n^+$-type regions 110 and an inner boundary of the p-body region 100. Therefore, the n-type region 160 of the preset invention reduces the width of the channel region 170 (from a width "x" of 90-95% when the n-type region 160 that is formed with an angled implant is not used); thereby reducing the peak p-type doping level within the channel region. Thus, the robustness of the LDMOS transistors 20, 30 is increased for a targeted threshold voltage ("$V_t$") by increasing the on-state breakdown voltage ("$BV_{on}$") and increasing the maximum power density that the device can handle.

Figure 2:
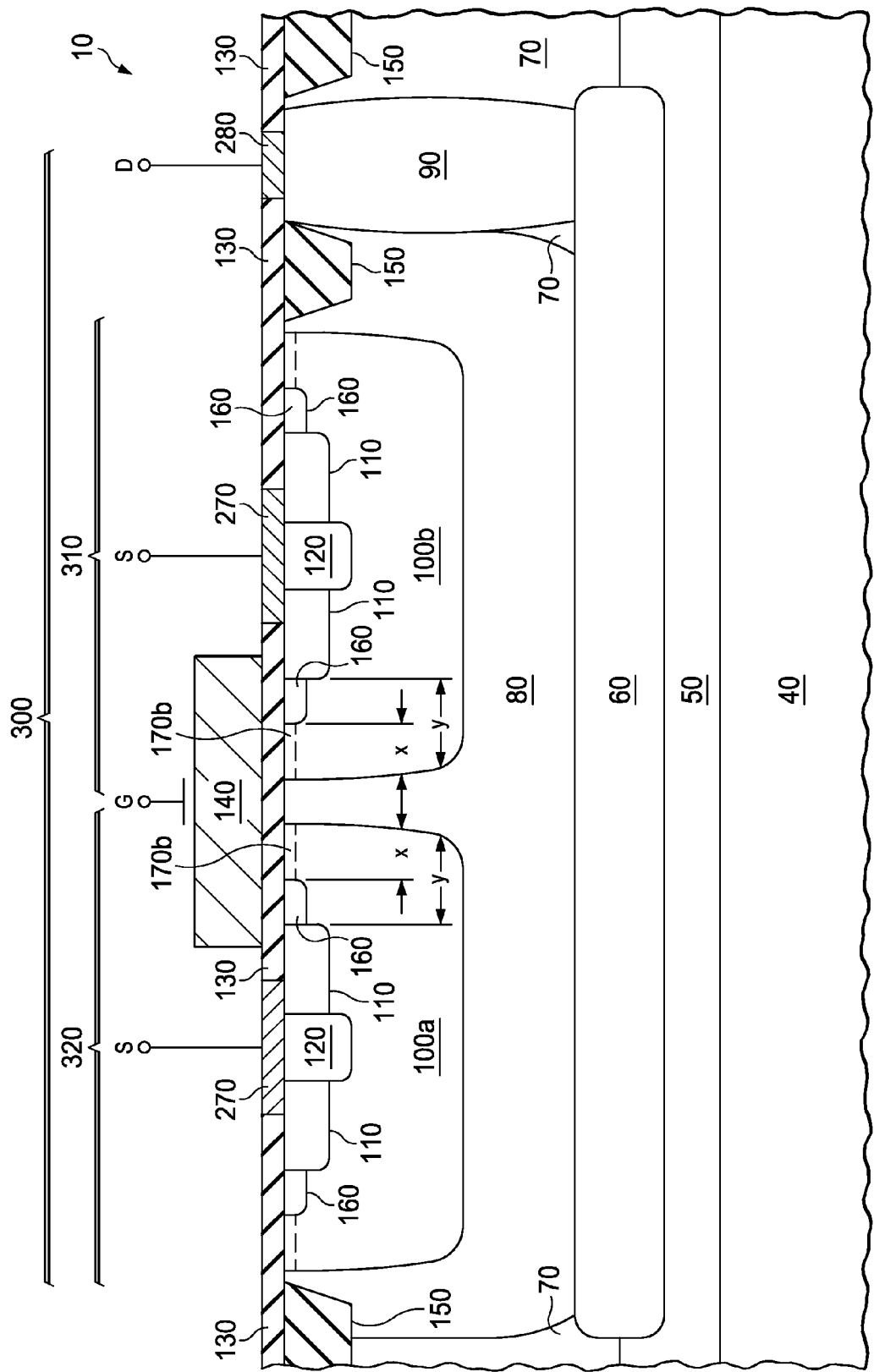
FIG. 2 is a cross-sectional view of a VDMOS in accordance with the present invention.

FIG. 2 is a cross-sectional view of a VDMOS transistor 300 in accordance with the present invention. In the example application, the VDMOS transistor 300 is formed within a semiconductor wafer 10 having a $p^+$-type substrate 40. The semiconductor wafer 10 also has a first $p^-$-type doped epitaxial layer 50, a second $p^-$-type epitaxial layer 70, and n-buried layer 60 included within the first and second $p^-$-type epitaxial layers 50, 70. The second $p^-$-type epitaxial layer 70 also has an n-well 80 containing the VDMOS transistor 300.

The gate of VDMOS transistor 300 is comprised of a gate dielectric 130 and a gate electrode 140. The two-part source region 310, 320 of VDMOS transistor 300 (having two source contacts 270) includes two p-body regions 100a, 100b—each having $n^+$-type regions 110 plus a $p^+$-type region 120. The drain of VDMOS transistor 300 (having a drain contact 280) is a deep n-type sinker 90 that is electrically coupled to the n-buried layer 60 and the n-well 80. As shown in FIG. 2, the drain 90 is extended from the gate electrode 140 by one of the source regions 310 and by an isolation region 150. Additional isolation regions 150 that are formed within the p⁻-type epitaxial layer 70 electrically insulate the VDMOS transistor 300 from other active devices located within the semiconductor wafer 10 (not shown). In the example application, the isolation regions 150 are STI structures; however, any conventional isolation structures may be used such as field oxide regions, implanted isolation regions, or deposited isolation regions.

In accordance with the example embodiment, the p-body regions 100a, 100b include n-type regions 160 that are formed with an angled implant that exceeds the implant angle that is used to form the p-body regions 100a, 100b, as described infra. As shown in FIG. 2, the channel regions 170a, 170b of VDMOS transistors 300 are located (below the gate electrode 140) close to the surface of p-body regions 100a, 100b between an outer boundary of an n-type region 160 and an inner boundary of the p-body regions 100a, 100b. Therefore, the n-type regions 160 decrease the width of the channel regions 170a, 170b of the VDMOS transistor 300. In the example application, the width "x" of the channel regions 170a, 170b are 60-80% of the width "y" of the surface of p-body regions 100a, 100b located under the gate electrode 140 between an outer boundary of n⁺-type regions 110 and an inner boundary of the p-body regions 100a, 100b. Therefore, the n-type regions 160 of the preset invention reduce the width of the channel regions 170a, 170b (compared to a width "x" of 90-95% when n-type regions 160 that are formed with an angled implant are not used); thereby reducing the peak p-type doping within the channel regions 170a, 170b. The reduced channel width increases the maximum power density and increases the device robustness (by increasing the on-state breakdown voltage $BV_{on}$) for a targeted threshold voltage ("$V_t$") of VDMOS transistor 300.

Referring again to the drawings, FIGS. 3A-3M are cross-sectional views of a partially fabricated semiconductor wafer 10 illustrating a process for forming the two example LDMOS transistors 20, 30 of FIG. 1 in accordance with the present invention. The following example application is exemplary but not restrictive of alternative ways of implementing the principles of the invention. Moreover, features and procedures whose implementations are well known to those skilled in the art are omitted for brevity. For example, the implementation of common fabrication steps lies within the ability of those skilled in the art and accordingly any detailed discussion thereof may be omitted.

Figure 3A:
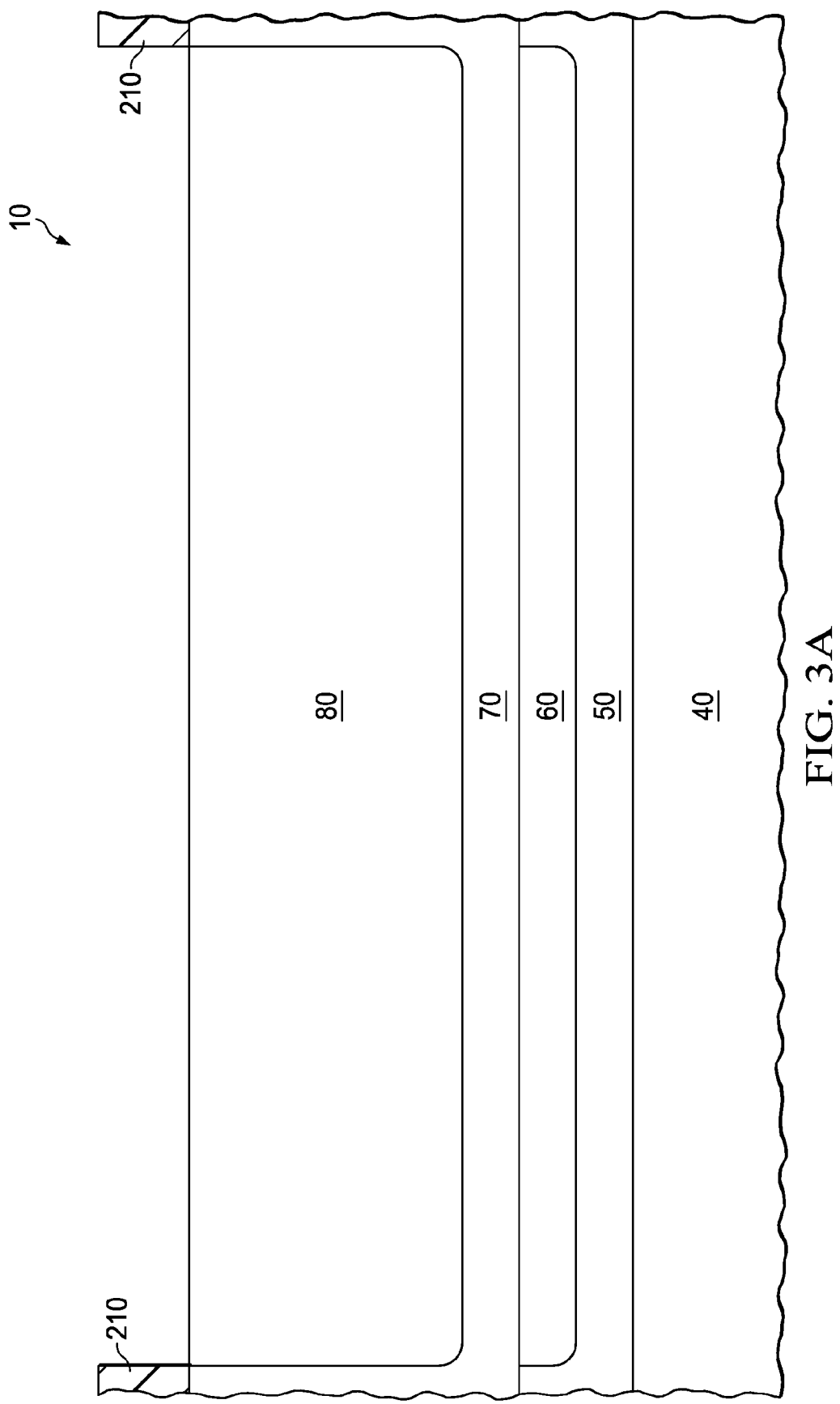
FIGS. 3A-3M are cross-sectional diagrams of a process for forming a LDMOS in accordance with an embodiment of the invention.

FIG. 3A is a cross-sectional view of the semiconductor wafer 10 after the formation of the n-well 80 within the semiconductor wafer 10. In the example application, the semiconductor wafer includes a p⁺-type substrate 40, a first p⁻-type doped epitaxial layer 50 (that may contain an n-buried layer 60), and a second p-type epitaxial layer 70; however any suitable materials or layers of materials may be used. The n-well 80 is formed by any standard process (i.e. ion implantation) that implants n-type dopants into the second p-type epitaxial layer 70. The implanted n-type dopants are usually P (phosphorous) or As (arsenic). A patterned photoresist 210 may be used as a mask to define the location of the n-well 80 during the implantation of the n-type dopant. Upon completion of the well implantation process, the patterned photoresist 210 is removed with a standard ash and clean process.

Figure 3B:
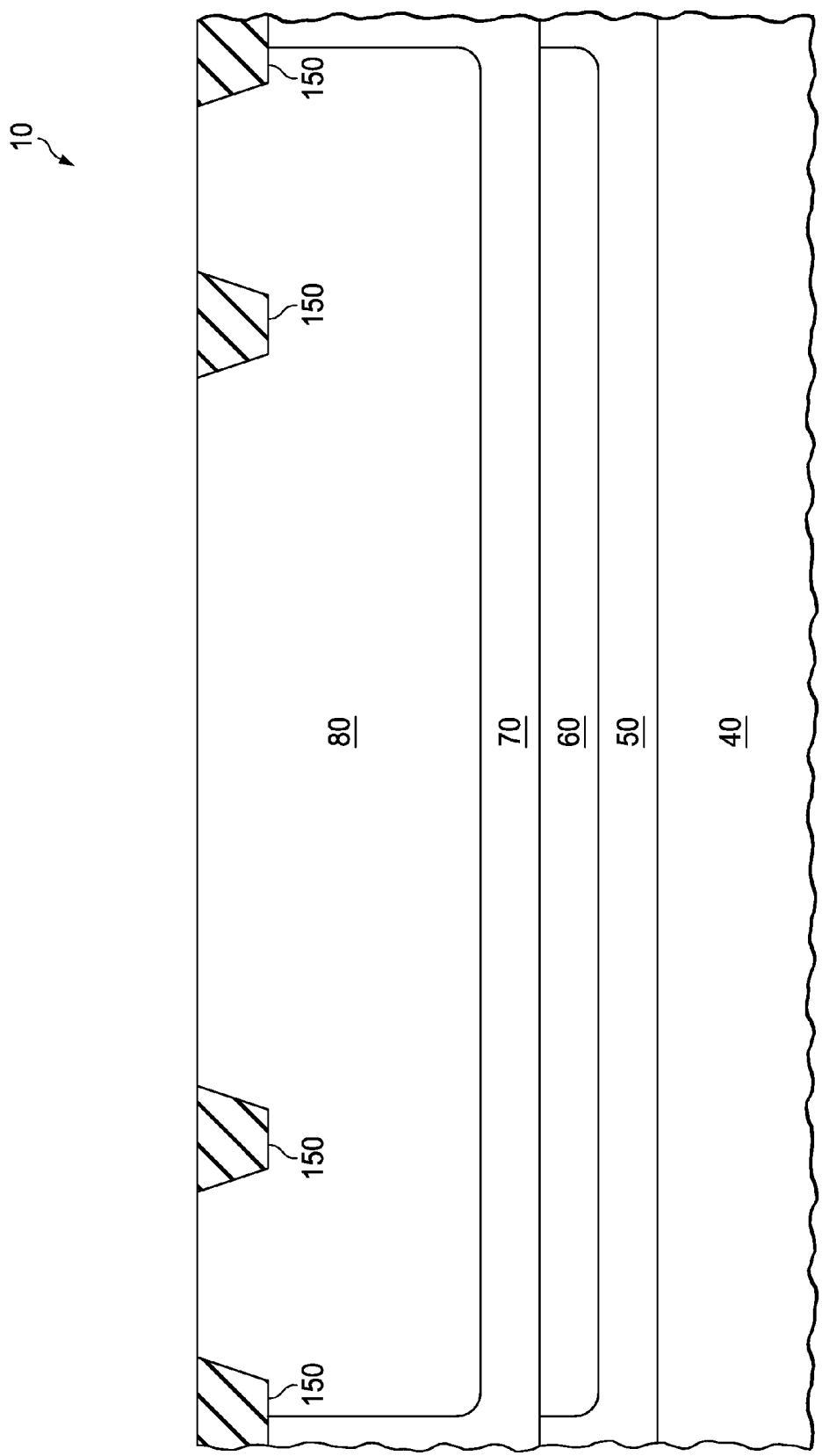

Isolation regions 150 are now formed within the surface of the n-well 80 using any suitable process, as shown in FIG. 3B. For example, shallow trench isolation structures 150 may be formed by etching shallow trenches in the selected locations, and then using standard growth or deposition processes to form one or more layers of insulating material (i.e. $SiO_2$) within the trenches. Alternatively, the isolation regions 150 may be FOX, LOCOS, or another suitable structure, as noted supra.

Figure 3C:
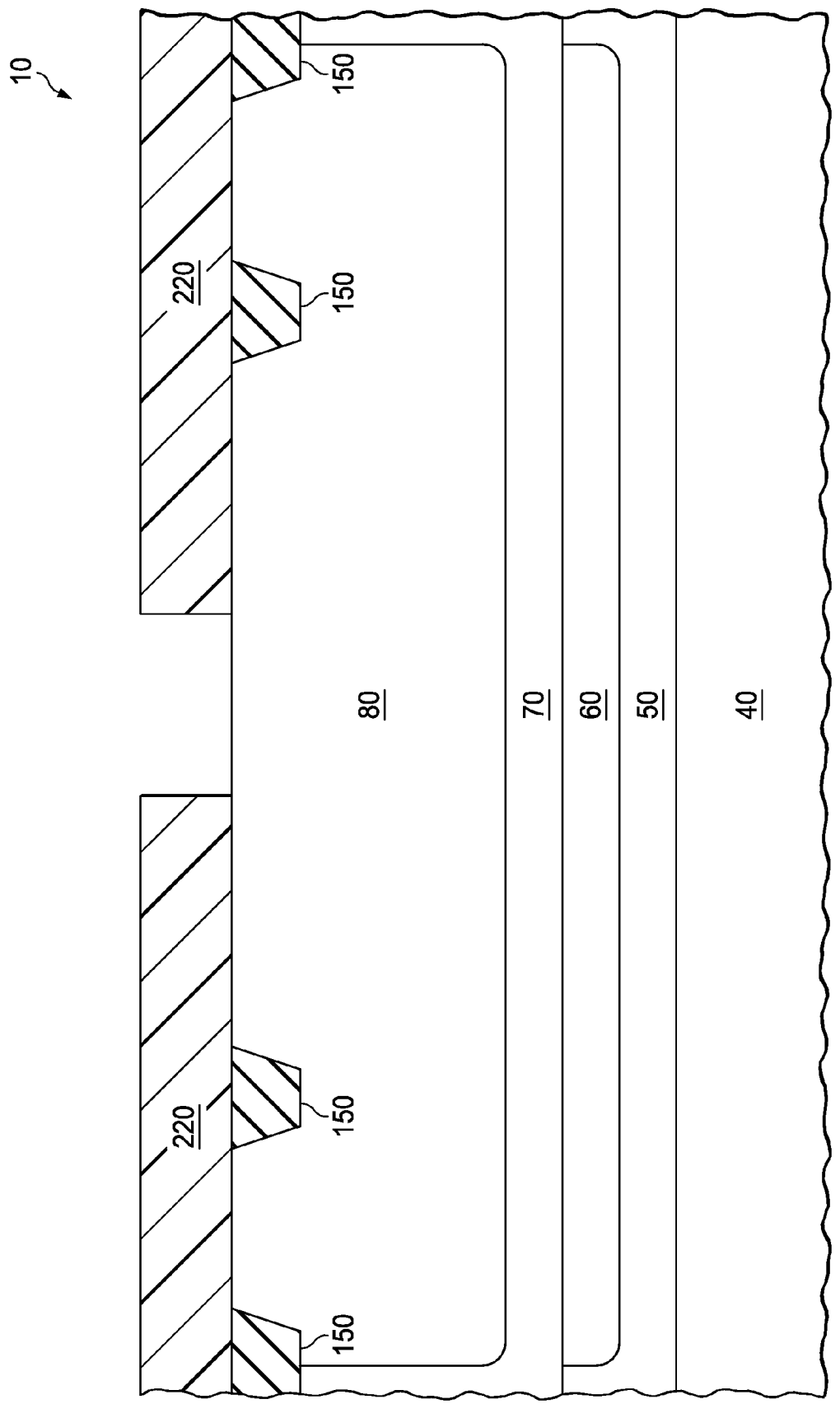

Another patterned photoresist 220 is now used as a mask for the implantation of p-type dopants and n-type dopants into the n-well 80. As shown in FIG. 3C, a layer of standard photoresist material is formed over the semiconductor wafer 10 and then etched to form a patterned photoresist 220 that exposes the n-well 80 at the targeted locations for the shared source of the two LDMOS transistors 20, 30.

Figure 3D:
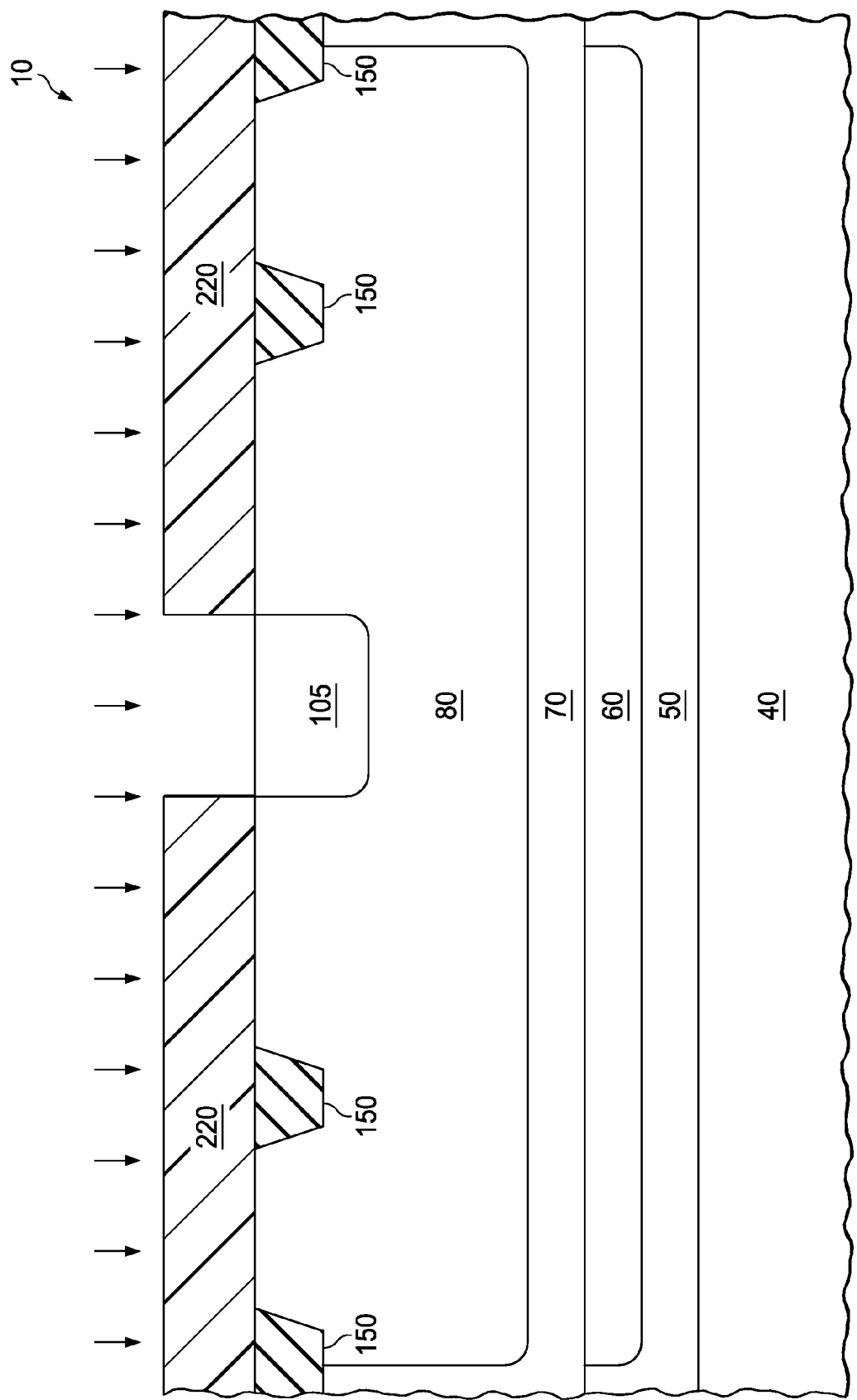

In accordance with the example embodiment, p-type dopants are now implanted into the n-well 80, as shown in FIG. 3D. The p-type dopant is boron ("B"); however, another p-type dopant (i.e. $BF_2$) or any combination of dopants may be used. In addition, any suitable mid-current or high-current machine, such as the GSD (sold by Axcelis), may be used to form the p-type implant 105. Moreover, the p-type implantation process may use any suitable dose between $5e^{13}$-$5e^{14}$ and any suitable energy between 50 KeV and 400 KeV. The p-type dopants are implanted at a normal angle (i.e. close to 0°); however, it is within the scope of the invention to implant the p-type dopants 105 into the n-well 80 with an angled implant process.

Figure 3E:
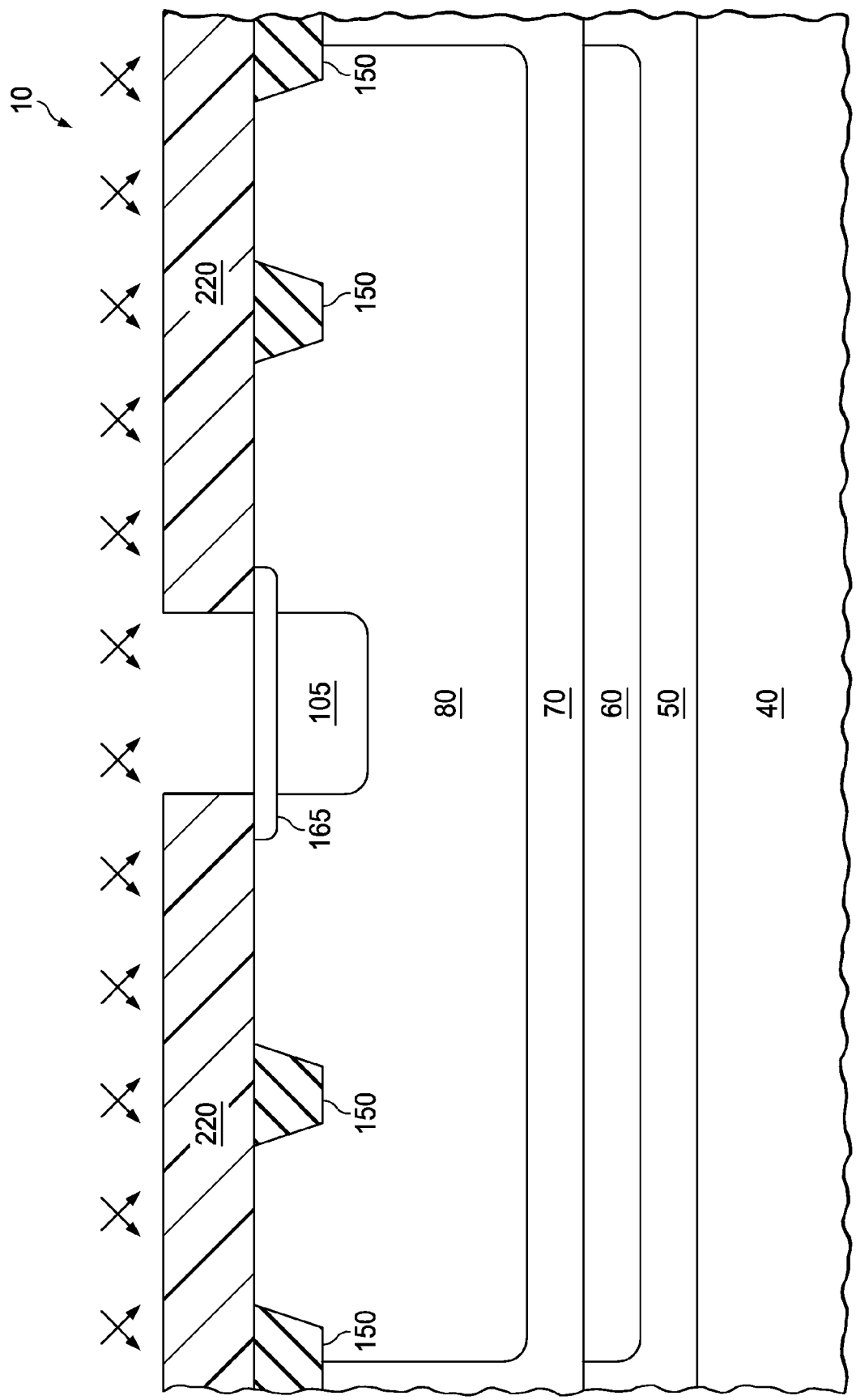
Figure 3F:
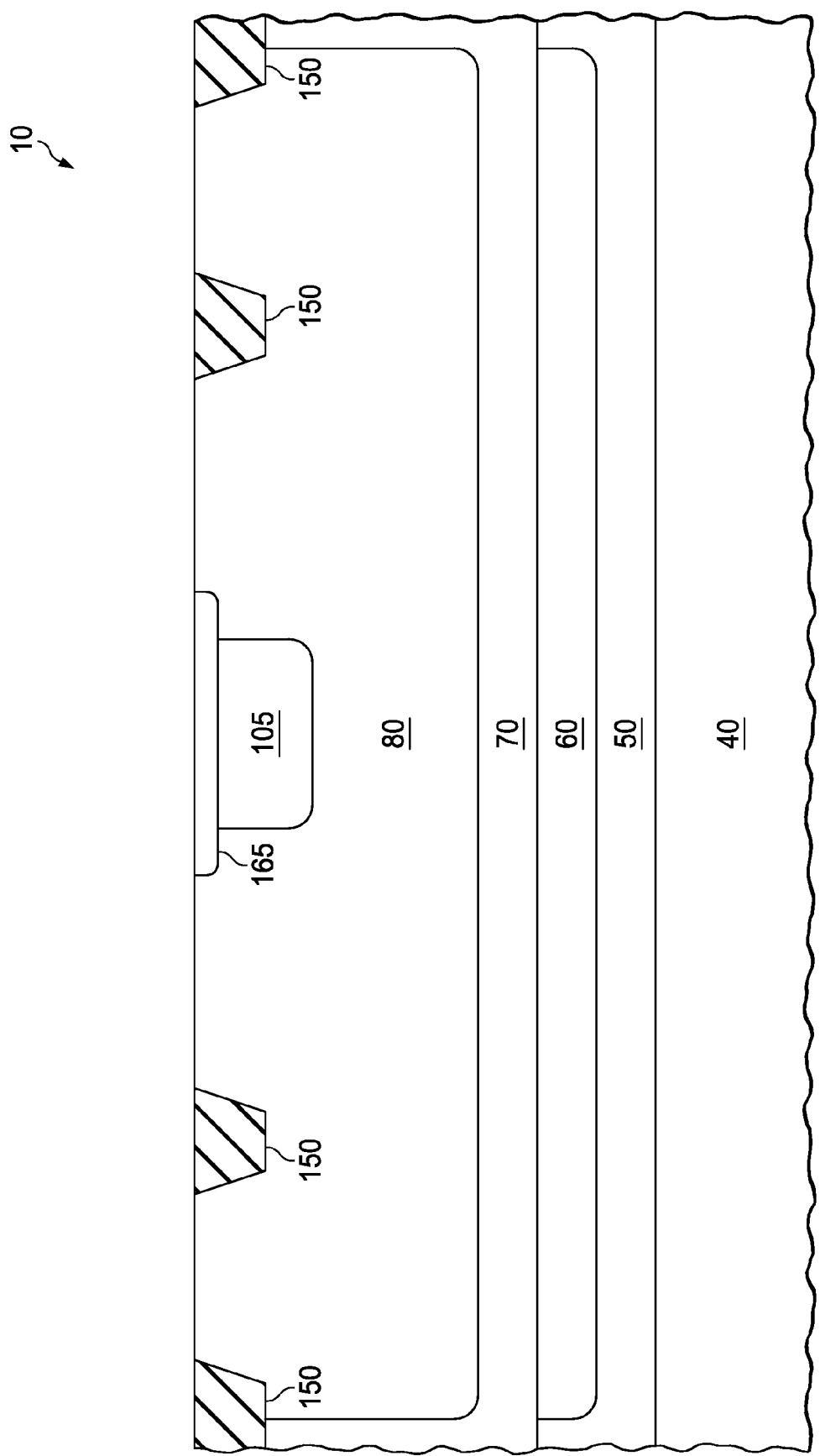

Next, n-type dopants 165 are implanted into the n-well 80 in-situ (either in the same chamber or a different chamber), as shown in FIG. 3E. The n-type dopant is As; however, another n-type dopant (e.g. Sb) or any combination of dopants may be used. The n-type implantation process may use any suitable dose between $6e^{13}$-$3e^{14}$ and any suitable energy between 120 KeV and 180 KeV. In accordance with the example embodiment, the n-type dopants are implanted at an angle that forms an implant region 165 having an outer boundary that extends laterally past the outer boundary of the p-type implant region 105 (as noted supra). The implantation angle of the n-type implant may be up to 25° greater than the implantation angle of the p-type implant. For example, if the p-type implant 105 is formed using an implant angle of 5°, than the n-type implant 165 may be formed using an implant angle of 30°. It is within the scope of the invention to rotate the wafer during the n-type implantation process to form a desired shape for the n-type implant region 165. (It is to be noted that the wafer may also be rotated during the p-type implant 105 if it is also an angled implant.) Upon completion of the implantation processes for the p-type dopant 105 and n-type dopant 165, the patterned photoresist 220 is removed with a standard ash and clean process, as shown in FIG. 3F.

It is to be noted that the p-type implant region 105 and the n-type implant region 165 were formed using the same mask 220. Therefore, they are self-aligned (i.e. co-implanted). It is also to be noted that the fabrication steps shown in FIGS. 3D and 3E could be switched—so that the n-type implant region 165 is formed before the p-type implant 105 region using the same mask 220.

Figure 4A:
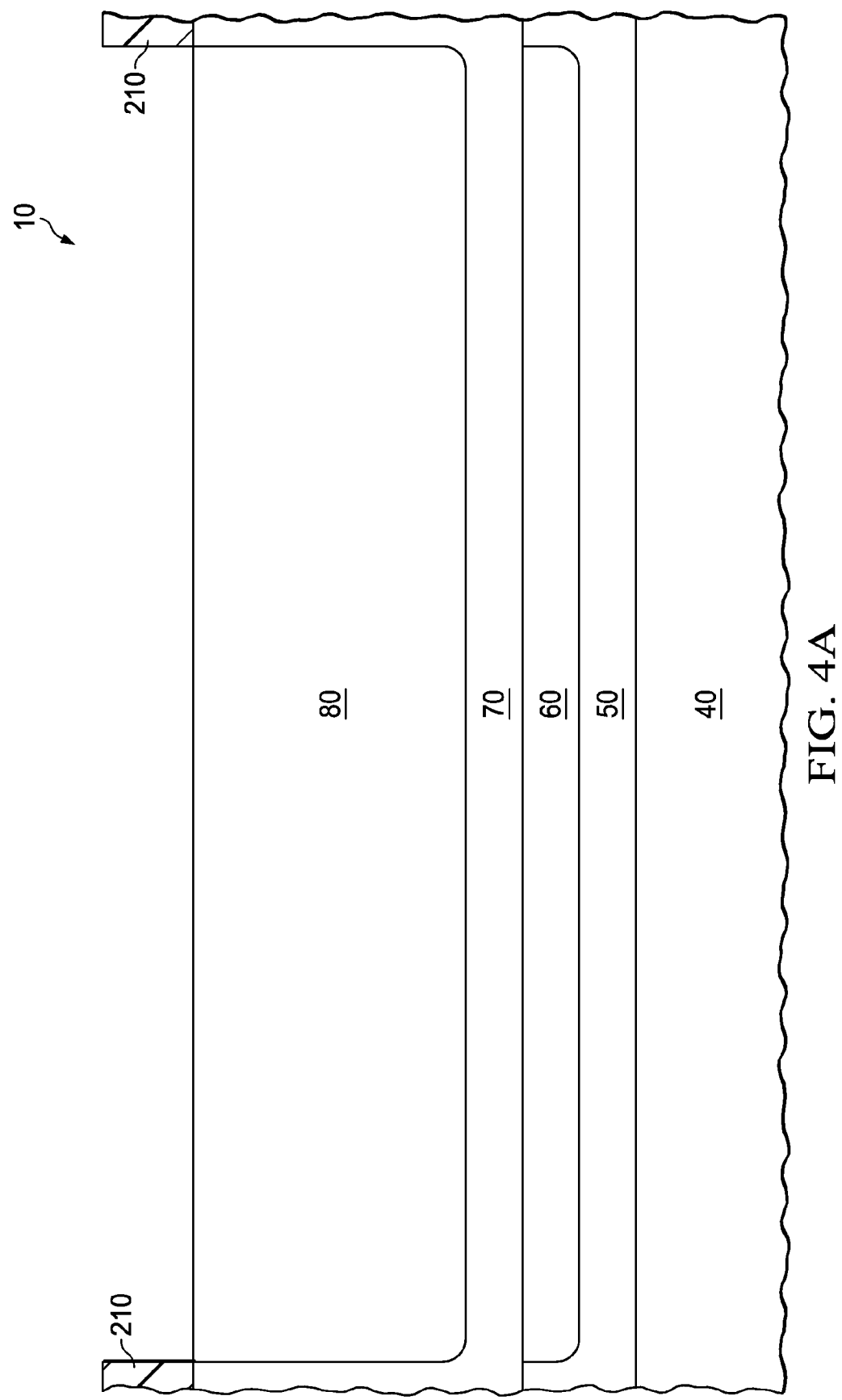
FIGS. 4A-4F are cross-sectional diagrams of a portion of a process for forming a LDMOS in accordance with an alternative embodiment of the invention.
Figure 4B:
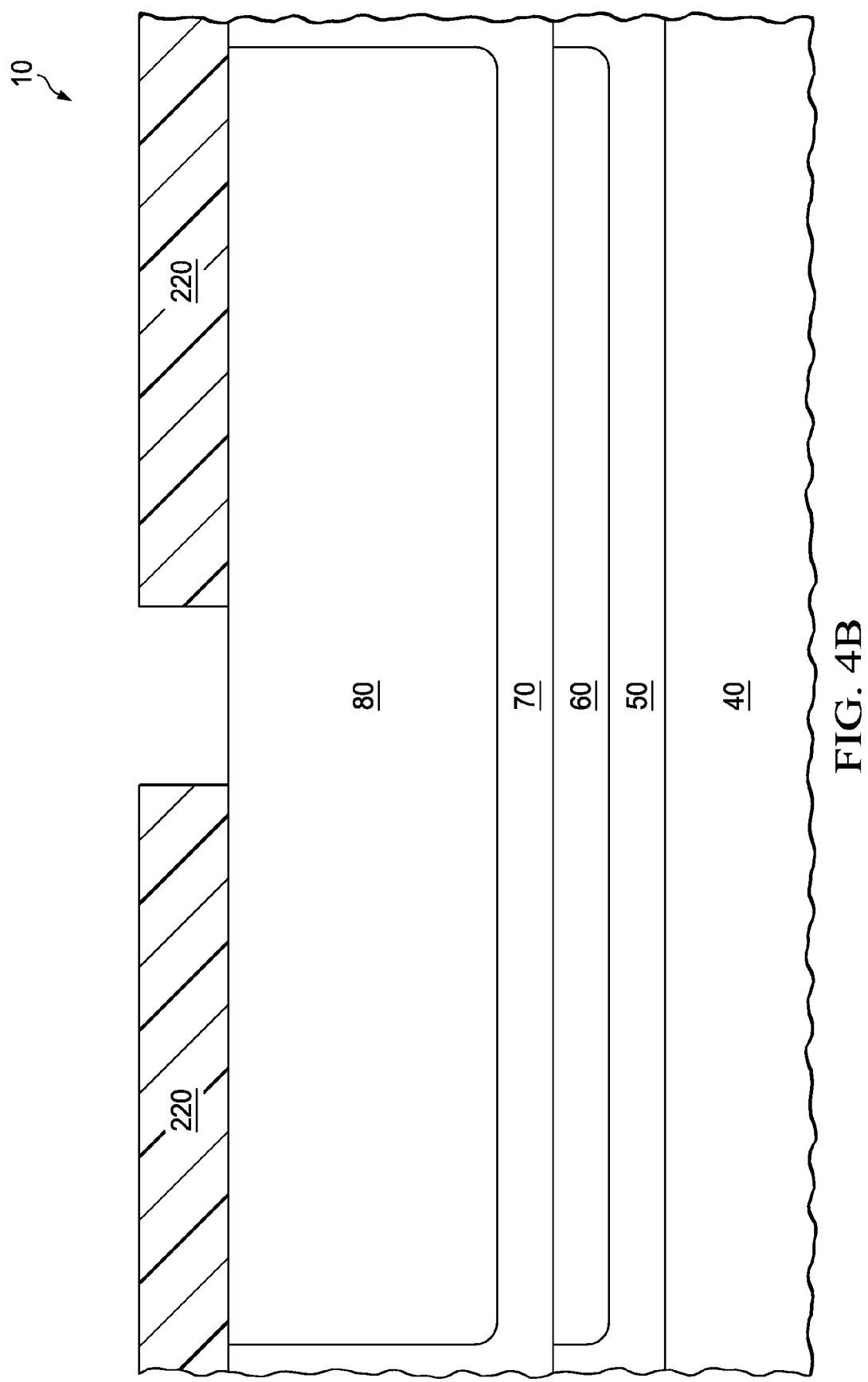

Moreover, instead of forming the isolation regions 150 before the p-type implant 105 and the n-type implant 165 as discussed supra, the isolation regions 150 may be formed after the p-type implant 105 and the n-type implant 165 using an alternative process flow, as shown in FIGS. 4A-4F. As shown in FIG. 4A, the semiconductor wafer 10 containing an n-well 80 of the alternative embodiment is similar to the semiconductor wafer 10 containing an n-well 80 of the example embodiment shown in FIG. 3A. A patterned photoresist 220 is now used as a mask for the implantation of p-type dopants and n-type dopants into the n-well 80, as shown in FIG. 4B.

Figure 4C:
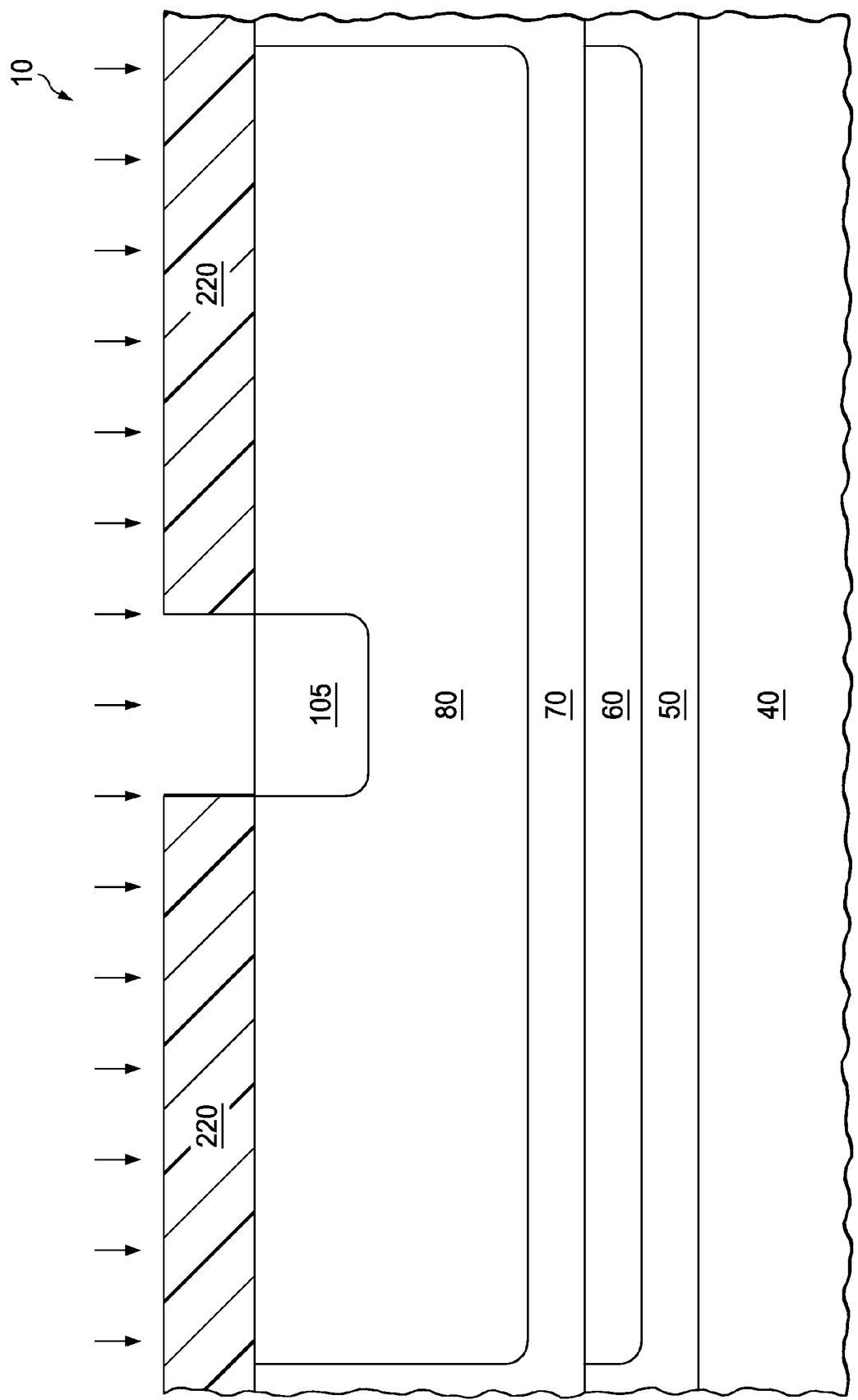

In accordance with the alternative embodiment, p-type dopants are now implanted into the n-well 80, as shown in FIG. 4C. The p-type dopant is B; however, another p-type dopant or combination of dopants may be used. In addition, any suitable mid-current or high-current machine may be used to form the p-type implant 105. Furthermore, the p-type implantation process may use any suitable dose between $5e^{13}$-$5e^{14}$ and any suitable energy between 50 KeV and 400 KeV. The p-type dopants are implanted at a normal angle (i.e. close to 0°); however, it is within the scope of the invention to implant the p-type dopants into the n-well 80 with an angled implant process.

Figure 4D:
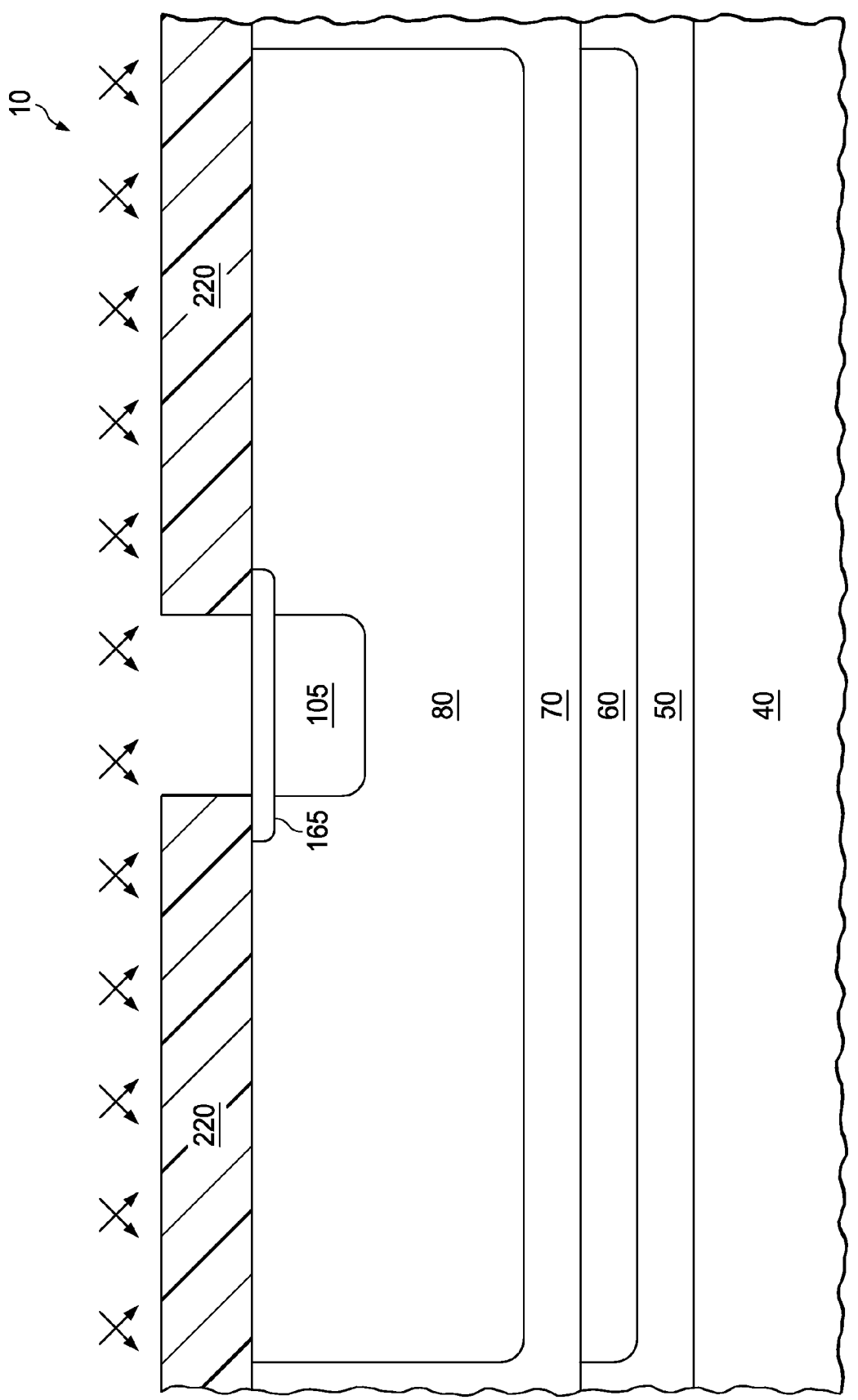
Figure 4E:
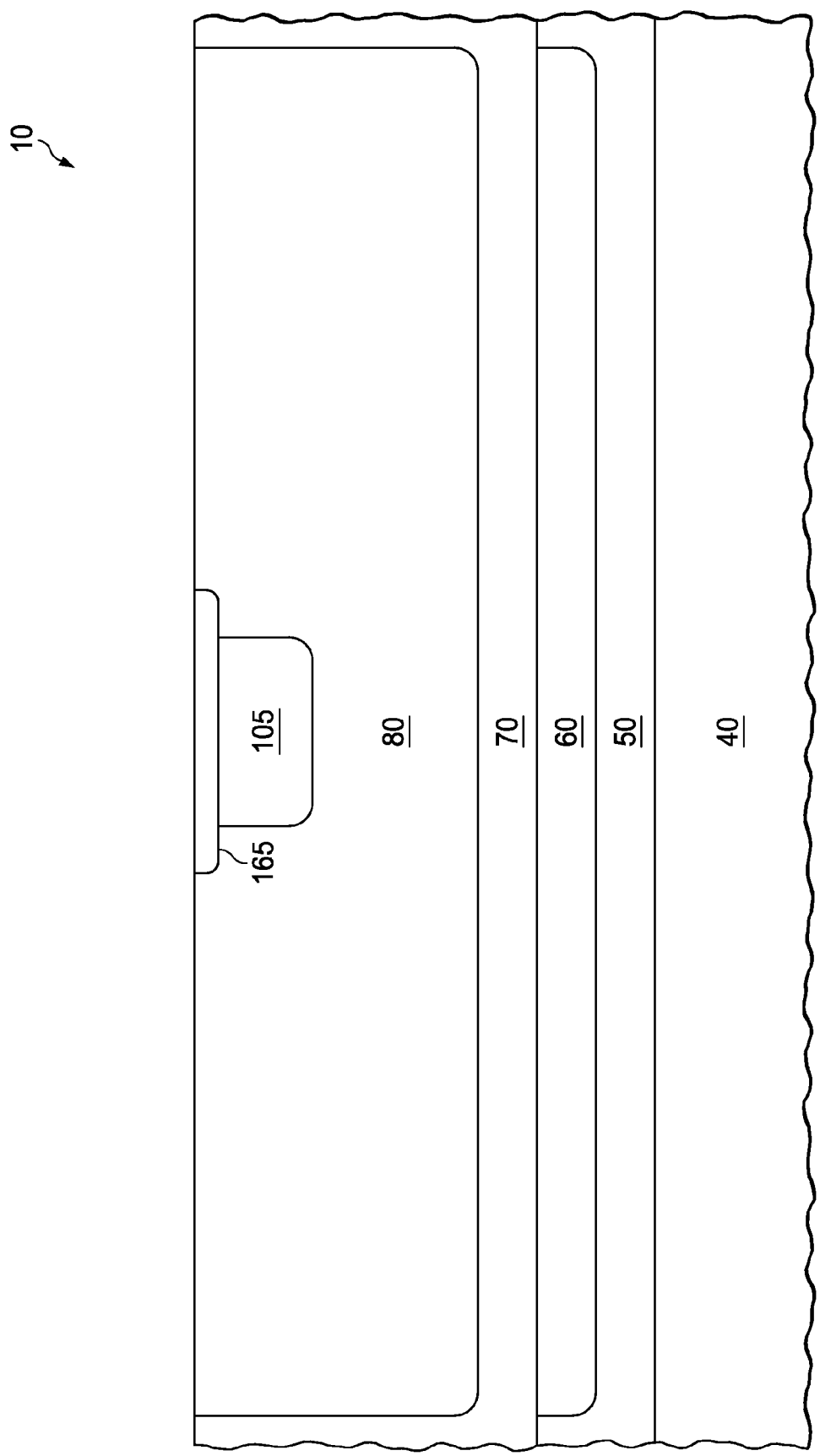

As shown in FIG. 4D, n-type dopants 165 are subsequently implanted into the n-well 80. This implantation process is performed in-situ, either in the same chamber or a different chamber. The n-type dopant is As; however, another n-type dopant or combination of dopants may be used. The n-type implantation process may use any suitable dose between $6e^{13}$-$3e^{14}$ and any suitable energy between 120 KeV and 180 KeV. In accordance with the alternative embodiment, the n-type dopants are implanted at an angle that forms an implant region 165 having an outer boundary that extends laterally past the outer boundary of the p-type implant region 105. The implantation angle of the n-type implant may be up to 25° greater than the implantation angle of the p-type implant. For example, if the p-type implant 105 is formed using an implant angle of 5°, than the n-type implant 165 may be formed using an implant angle of 30°. It is within the scope of the invention to rotate the wafer during the n-type implantation process to form a desired n-type implant region shape 165. (The wafer may also be rotated during the p-type implant 105 if it is formed with an angled implant.) Upon completion of the implantation processes for the p-type dopant region 105 and n-type dopant region 165, the patterned photoresist 220 is removed with a standard ash and clean process, as shown in FIG. 4E.

It is to be noted that the p-type implant 105 and the n-type implant 165 were formed using the same patterned photoresist mask 220. Therefore, they are self-aligned. It is also to be noted that the n-type implant region 165 may be formed before the p-type implant 105 region.

Figure 4F:
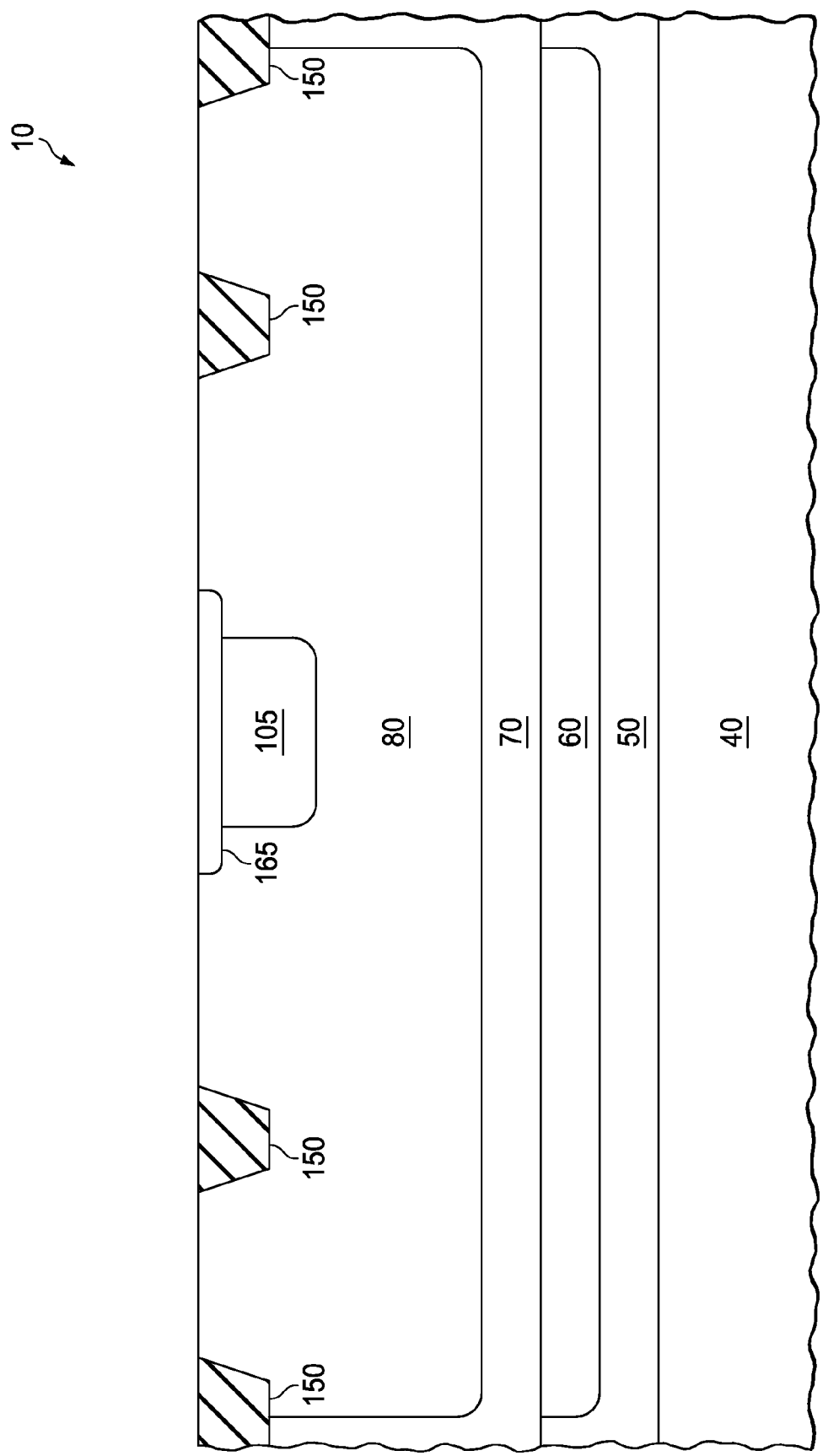

Isolation regions 150 are now formed within the surface of the n-well 80 using any suitable process, as shown in FIG. 4F. For example, shallow trench isolation structures 150 may be formed by etching shallow trenches in the selected locations, and then using standard growth or deposition processes to form one or more layers of insulating material within the trenches. Alternatively, the isolation regions 150 may be FOX, LOCOS, or another suitable structure, as noted supra.

Figure 3G:
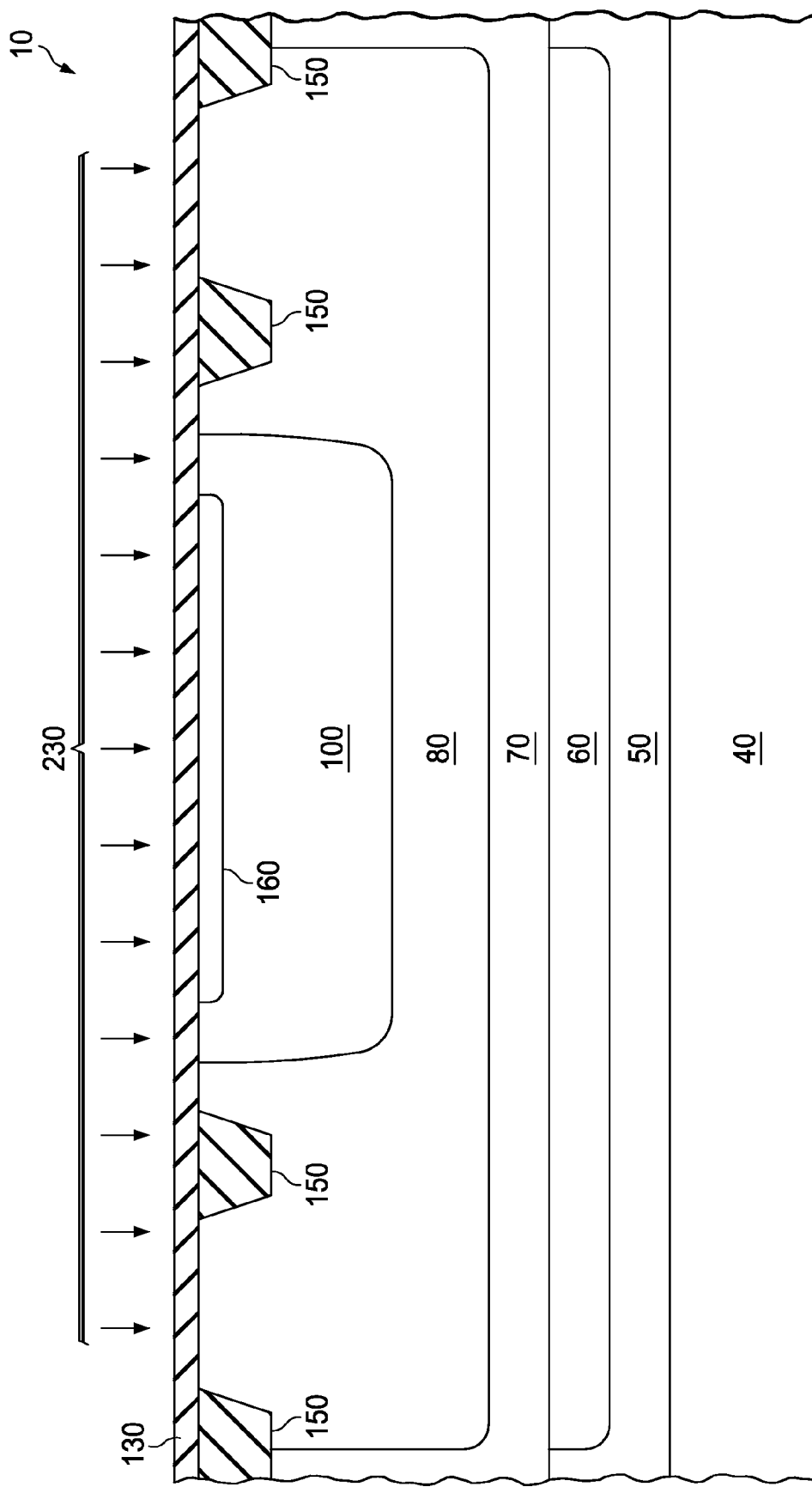

The next step in the fabrication of the semiconductor wafer 10 (for both the example embodiment, shown in FIGS. 3A-3F, and the alternative embodiment, shown in FIGS. 4A-4F) is a thermal process that diffuses the dopants in the p-type implant region 105 and the n-type implant region 165. This thermal process will also form a gate dielectric layer 130. In the example application, a standard thermal oxidation process 230 is used to grow the gate dielectric layer 130 within the surface of the semiconductor wafer 10, as shown in FIG. 3G. (However, the isolation regions 150 will retard the growth of the dielectric layer 130 over the surface of the isolation regions 150.) As also shown in FIG. 3G, the thermal oxidation process 230 facilitates the diffusion of the p-type implant 105 and the n-type implant 165 laterally and vertically, thereby forming the p-body region 100 and the n-type region 160 respectively.

The LDMOS transistors 20, 30 that are formed with the fabrication processes of either the example embodiment or the alternative embodiment have a high level of B doping within the p-body 100 to maximize robustness (i.e. the on-state breakdown voltage $BV_{on}$). In addition, the targeted threshold voltage $V_t$ is realized by the angled implant that is used to form the n-type regions 160 that are present within the p-body region 100. Moreover, the angled n-type implant (FIGS. 3E and 4D) compensates some of the peak p-type implant near the surface of the transistor channels but does not compensate the p-type implant in the depth region located away from the transistor channels. Thus, a lower threshold voltage ($V_t$) is achieved without compromising the robustness ($BV_{on}$) of the device.

Figure 3H:
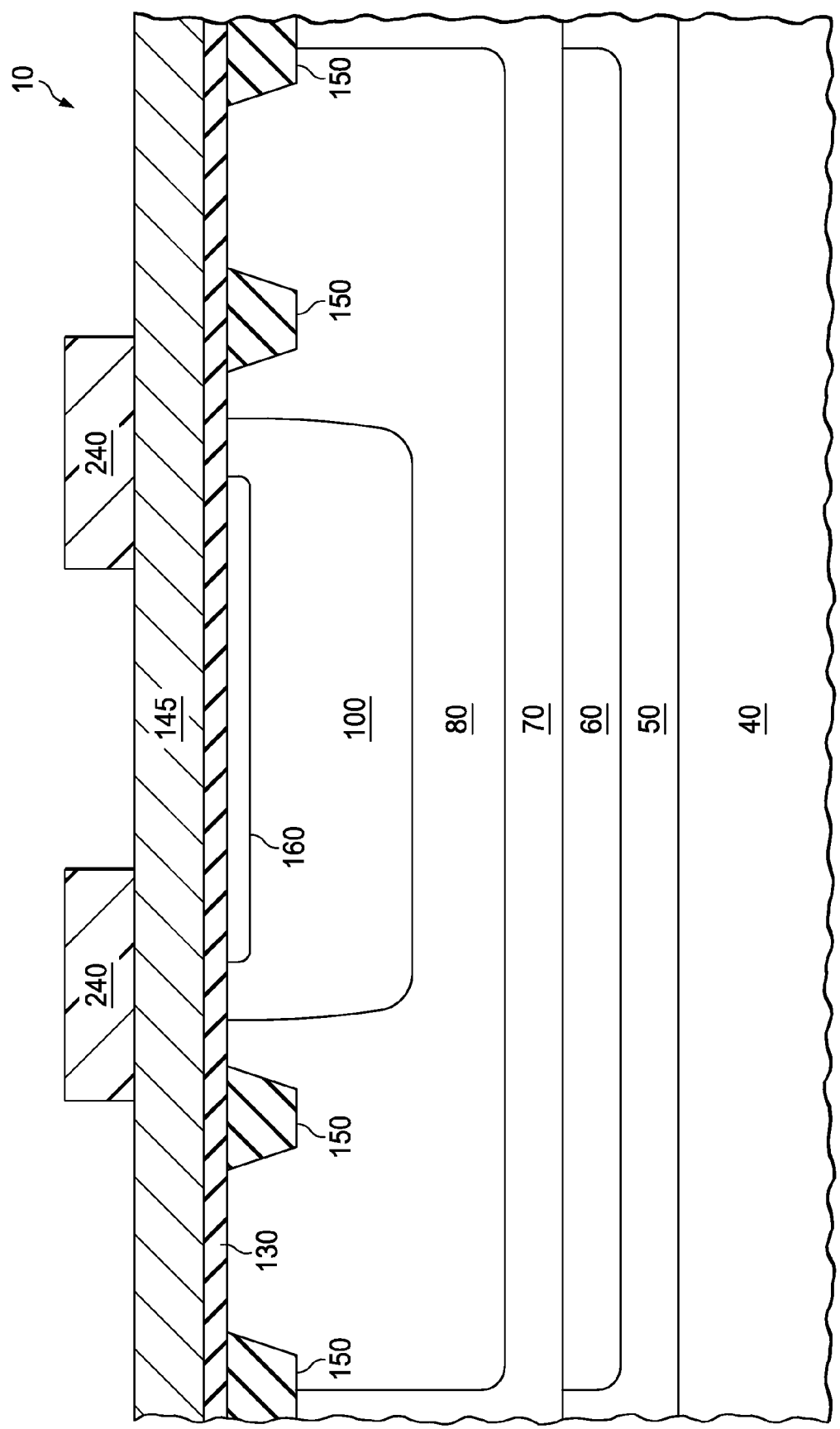
Figure 3I:
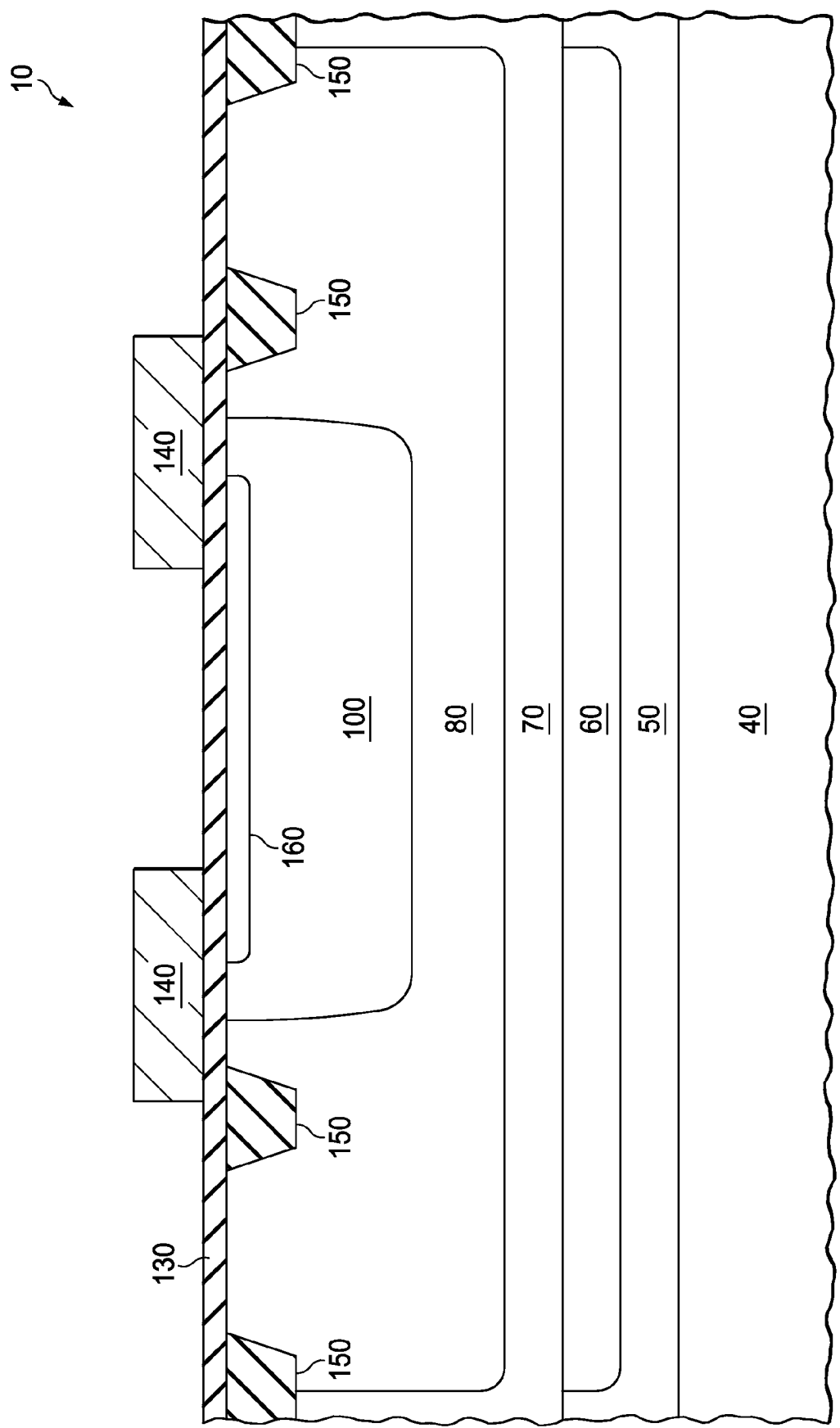

Standard process steps are now performed to complete the structure of the LDMOS transistors 20, 30. As shown in FIG. 3H, the gate electrode 140 of LDMOS transistors 20, 30 is formed by first depositing a layer of polysilicon material 145 (using any standard process technique such as CVD or PVD) and then creating a patterned photoresist mask 240 to protect the targeted gate electrode location. Any suitable etch process, such as an anisotropic etch using plasma or reactive ions, is used to strip the exposed (i.e. unwanted) polysilicon material 145. The patterned photoresist 240 is then removed using any suitable ashing process, resulting in the semiconductor wafer 10 having gate electrodes 140, as shown in FIG. 3I.

Figure 3J:
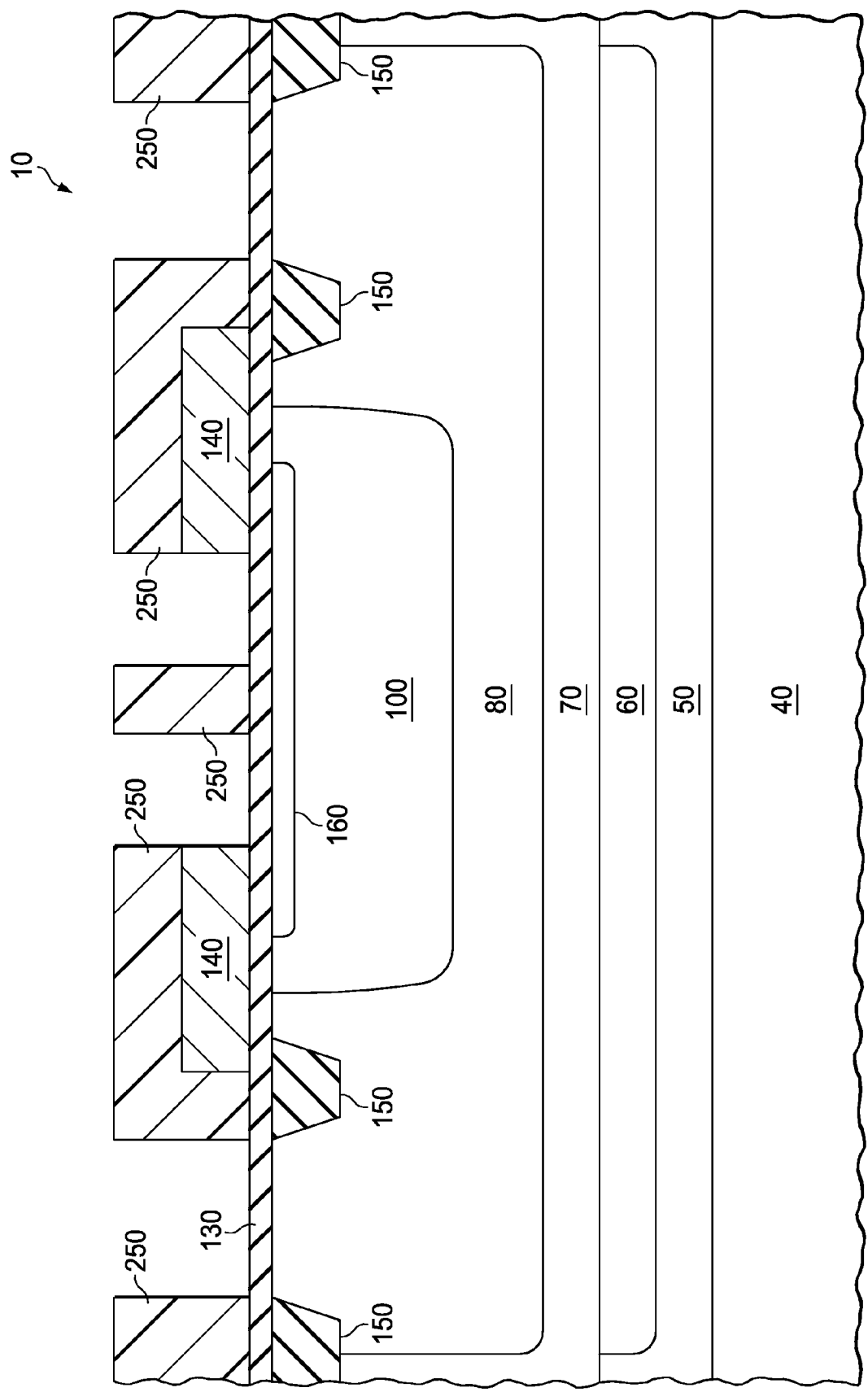
Figure 3K:
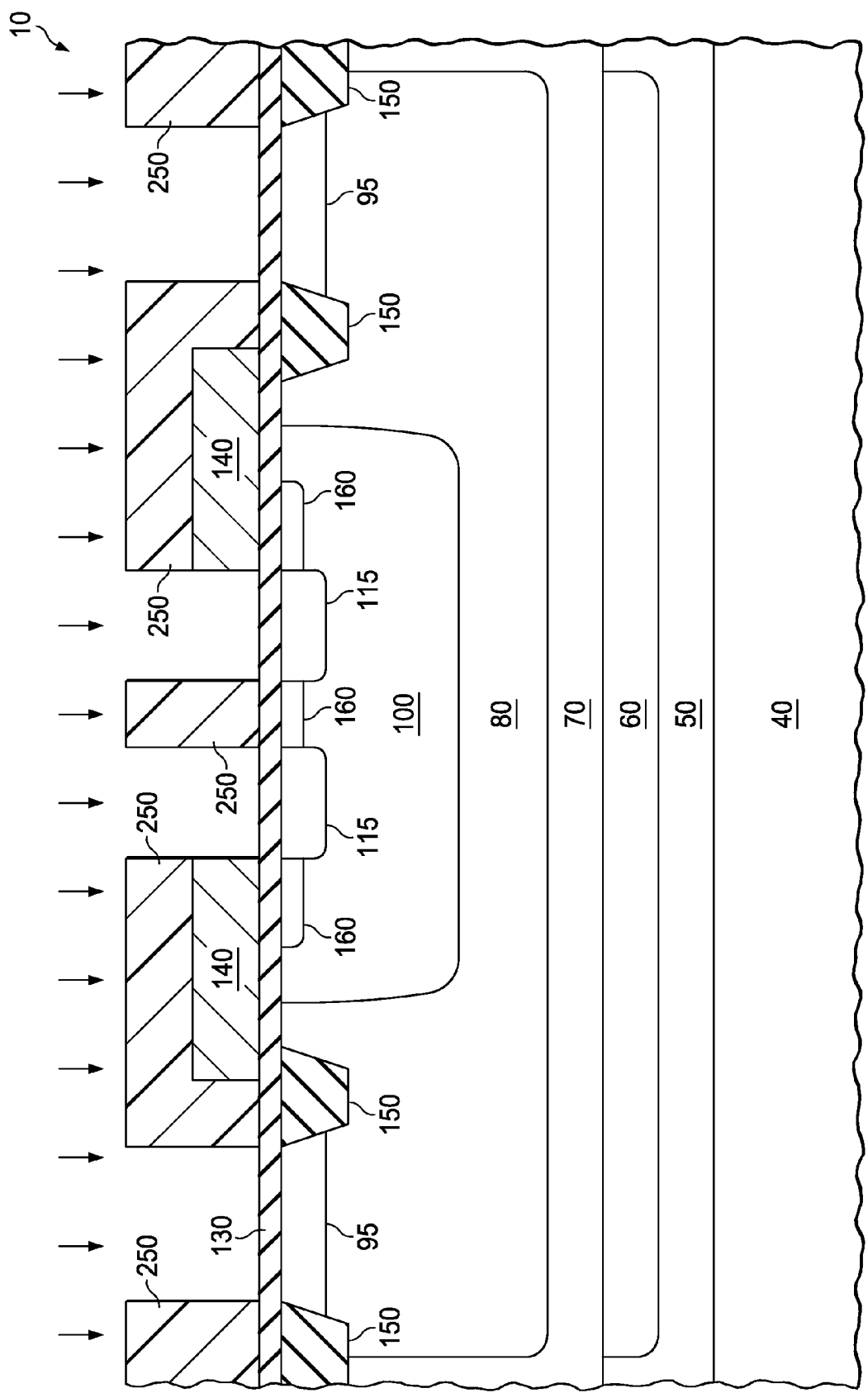

The source and drain for LDMOS transistors 20, 30 is now formed within the n-well 80 using any suitable manufacturing processes. In the example application, the $n^+$-type dopant regions 90, 110 are now created for the drains and the shared source of LDMOS transistors 20, 30. Initially, a patterned photoresist 250 is formed over the semiconductor wafer 10 to expose the targeted $n^+$-type locations of the drains and shared source, as shown in FIG. 3J. As shown in 3K, a standard implant process (i.e. low-energy ion implantation, gas phase diffusion, or solid phase diffusion) is now used to deposit a high concentration of n-type dopants. The dopants that are used to create the $n^+$-type dopant regions 95, 115 for the LDMOS transistors 20, 30 are P and As. However, other n-type dopants or combinations of n-type dopants may be used. (It is to be noted that the $n^+$-type dopants in region 115 will overwhelm the previously implanted n-type dopants of region 160 at the same location.)

Figure 3L:
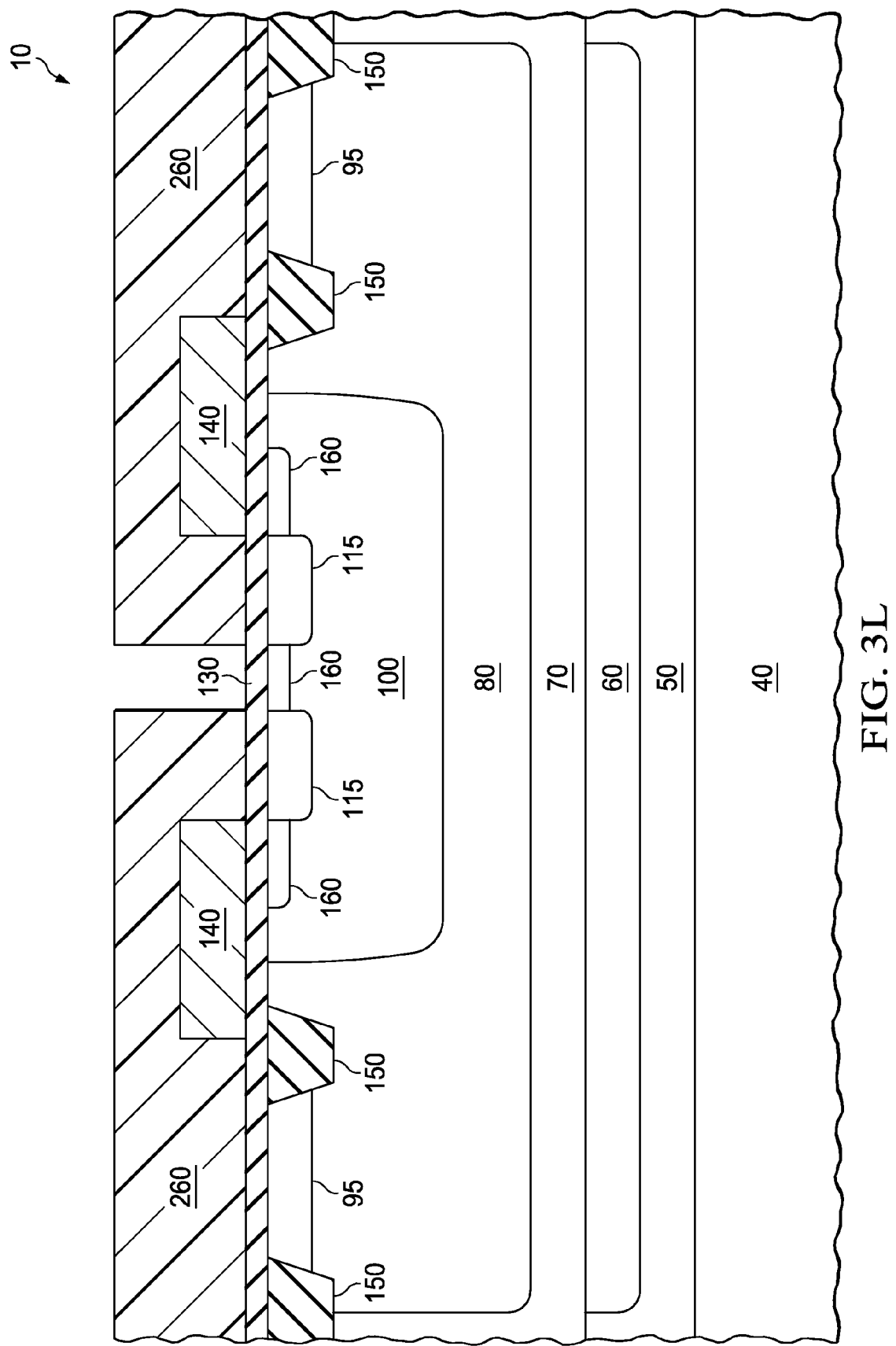
Figure 3M:
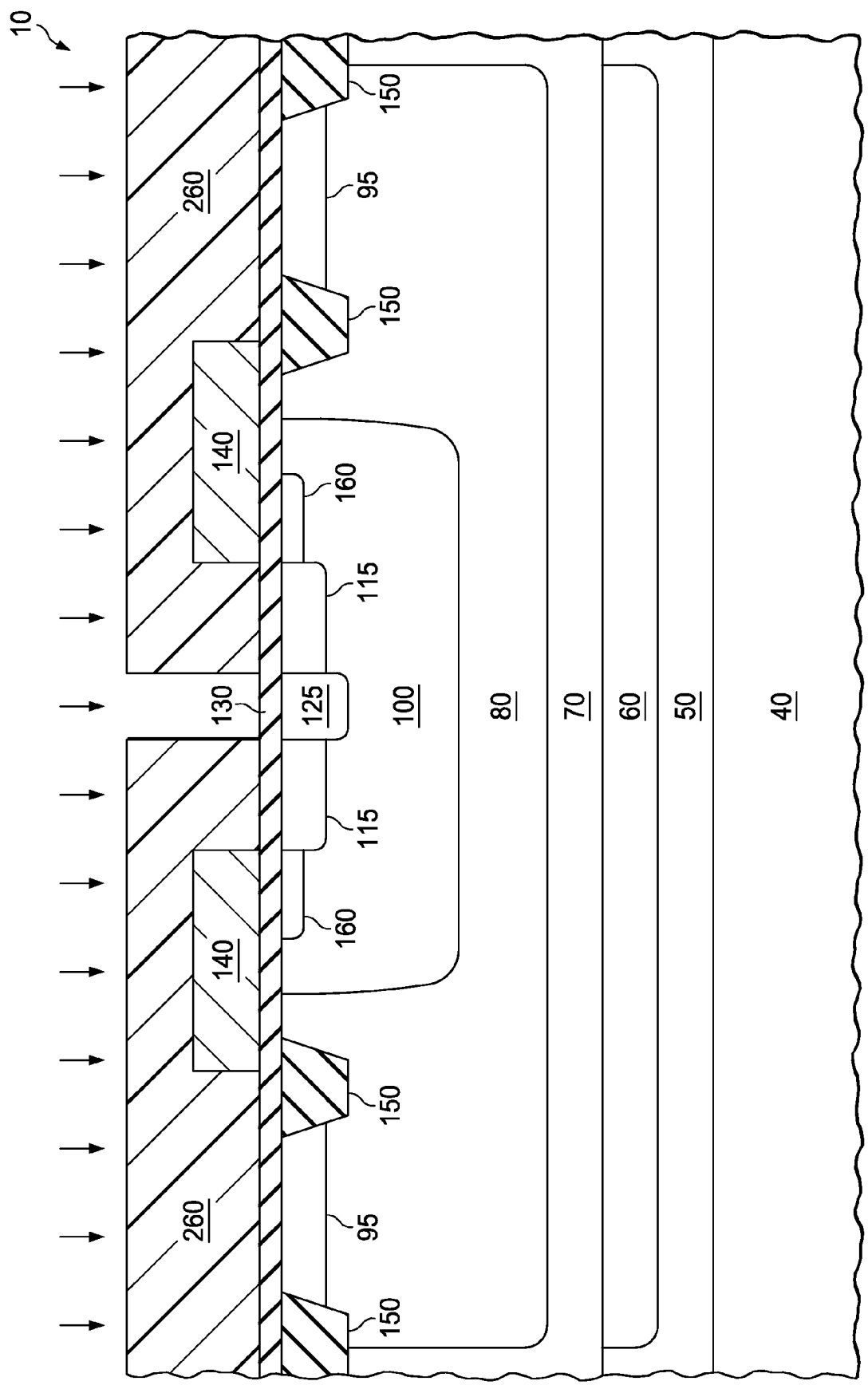

The patterned photoresist 250 is removed with a standard ash and clean process and a patterned photoresist 260 is formed that expose the targeted $p^+$-type location of the shared source, as shown in FIG. 3L. Another standard implant process (i.e. low-energy ion implantation, gas phase diffusion, or solid phase diffusion) is now used to deposit a high concentration of p-type dopants 125, as shown in FIG. 3M. The dopant that is used to create the $p^+$-type dopant region 125 for the LDMOS transistors 20, 30 is B. However, other p-type dopants or combinations of p-type dopants may be used. (It is to be noted that the $p^+$-type dopants in region 125 will overwhelm the previously implanted n-type dopants of region 160 at the same location.) Any standard ash and clean process is then used to remove the patterned photoresist 260.

The $p^+$-type dopant region 125 and the $n^+$-type dopant regions 95, 115 are now activated by an anneal process. This anneal step may be performed with any suitable process such as a rapid thermal anneal ("RTA"). This anneal step will likely cause a lateral migration of the $p^+$-type dopants and the $n^+$-type dopants, resulting in the $p^+$-type dopant region 120 and the $n^+$-type dopant regions 90, 110 shown in FIG. 1. The fabrication of the semiconductor wafer 10 now continues (with standard process steps) until the semiconductor device is complete.

Figure 5A:
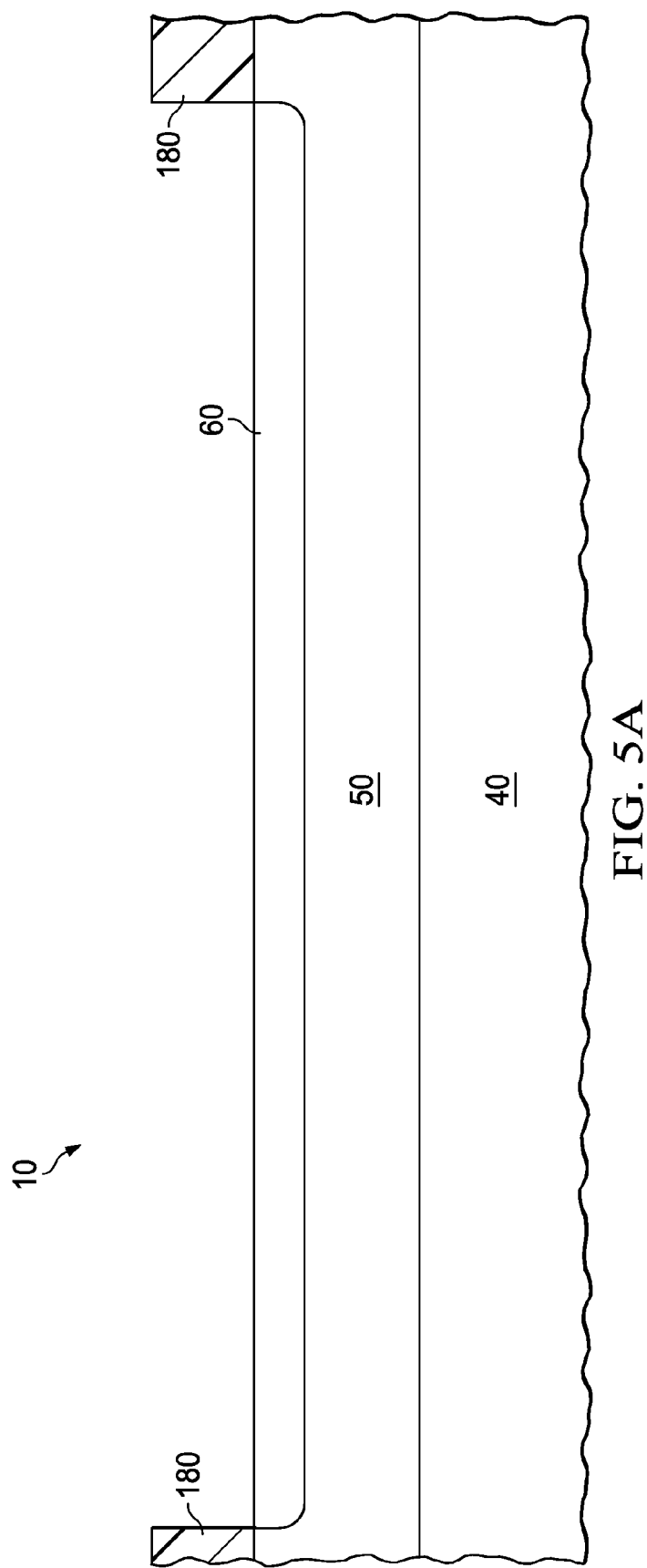
FIGS. 5A-5O are cross-sectional diagrams of a process for forming a VDMOS in accordance with an embodiment of the invention.
Figure 5B:
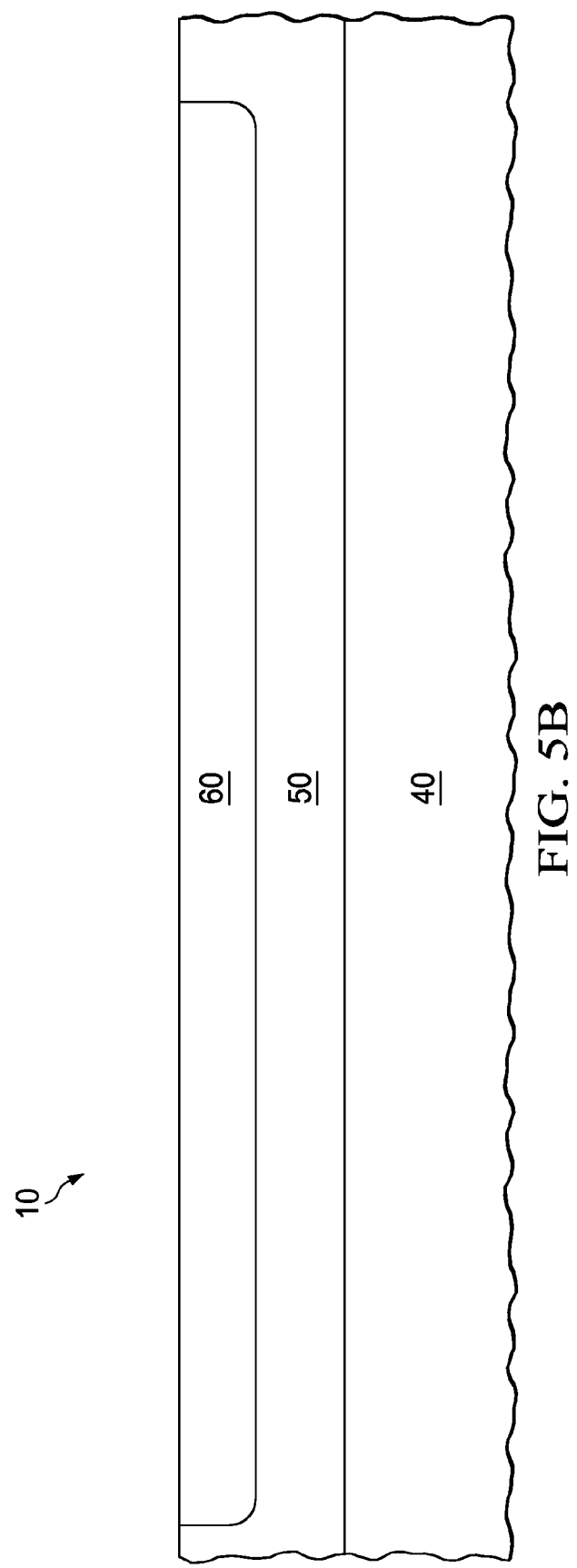
Figure 5C:
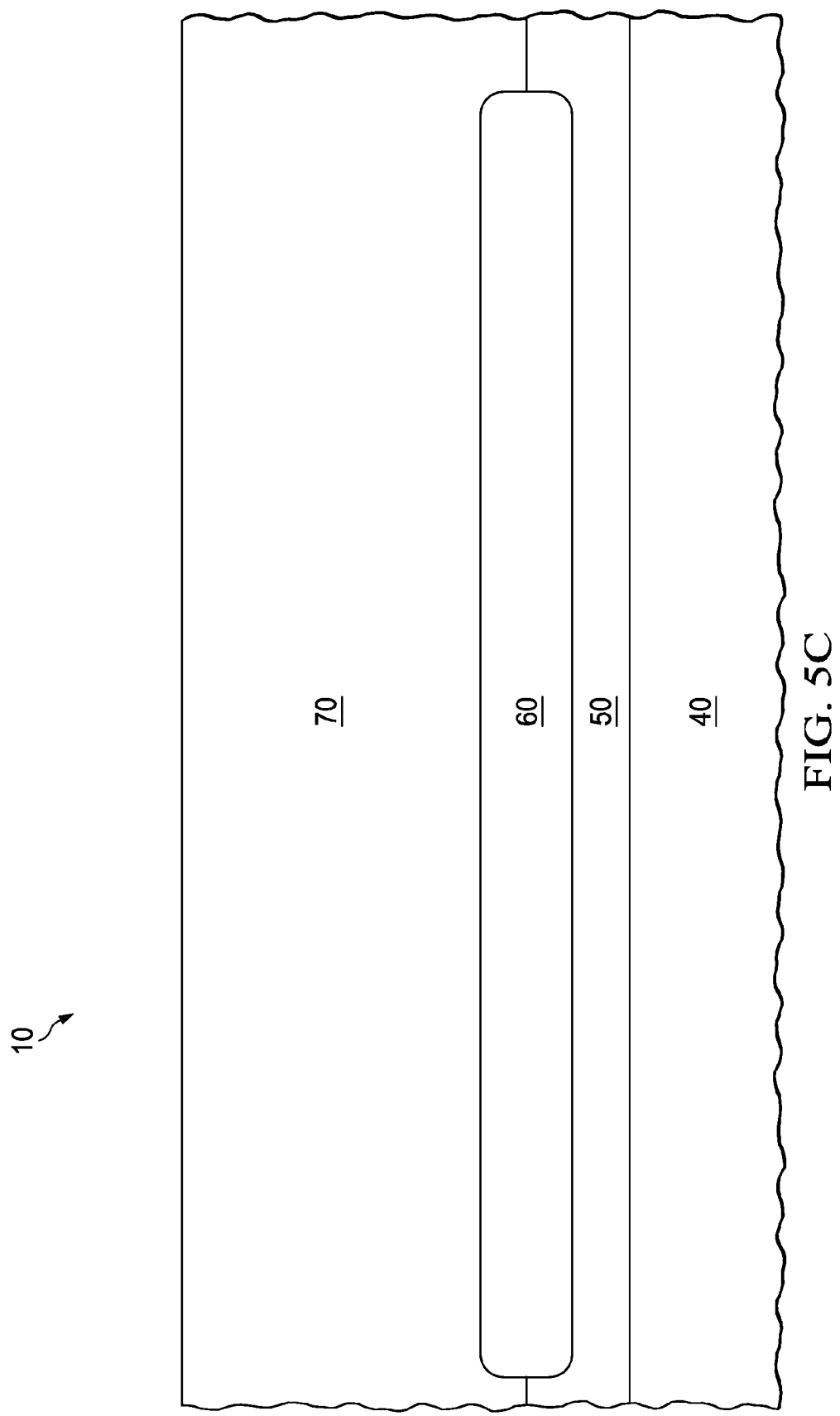
Figure 5D:
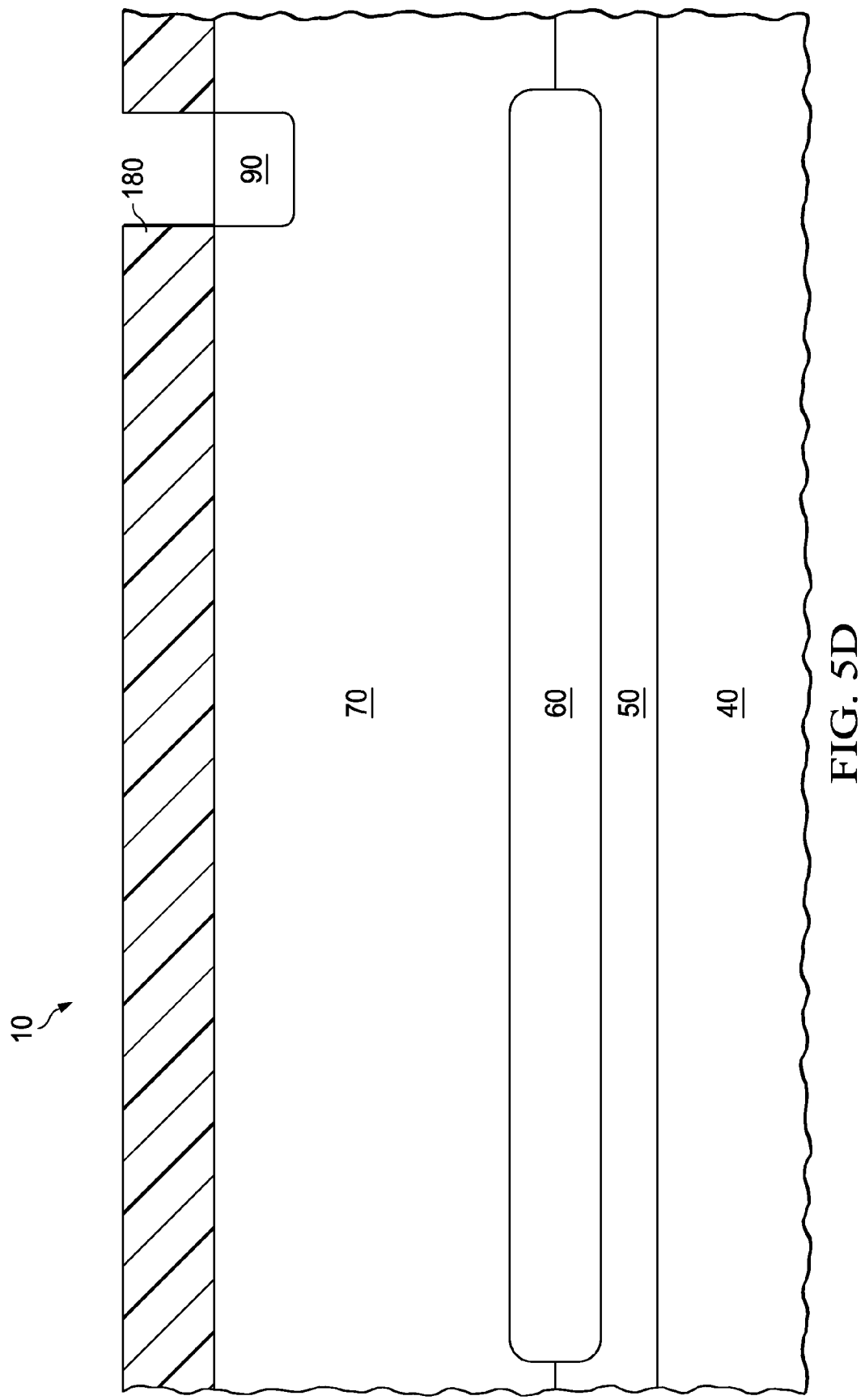
Figure 5E:
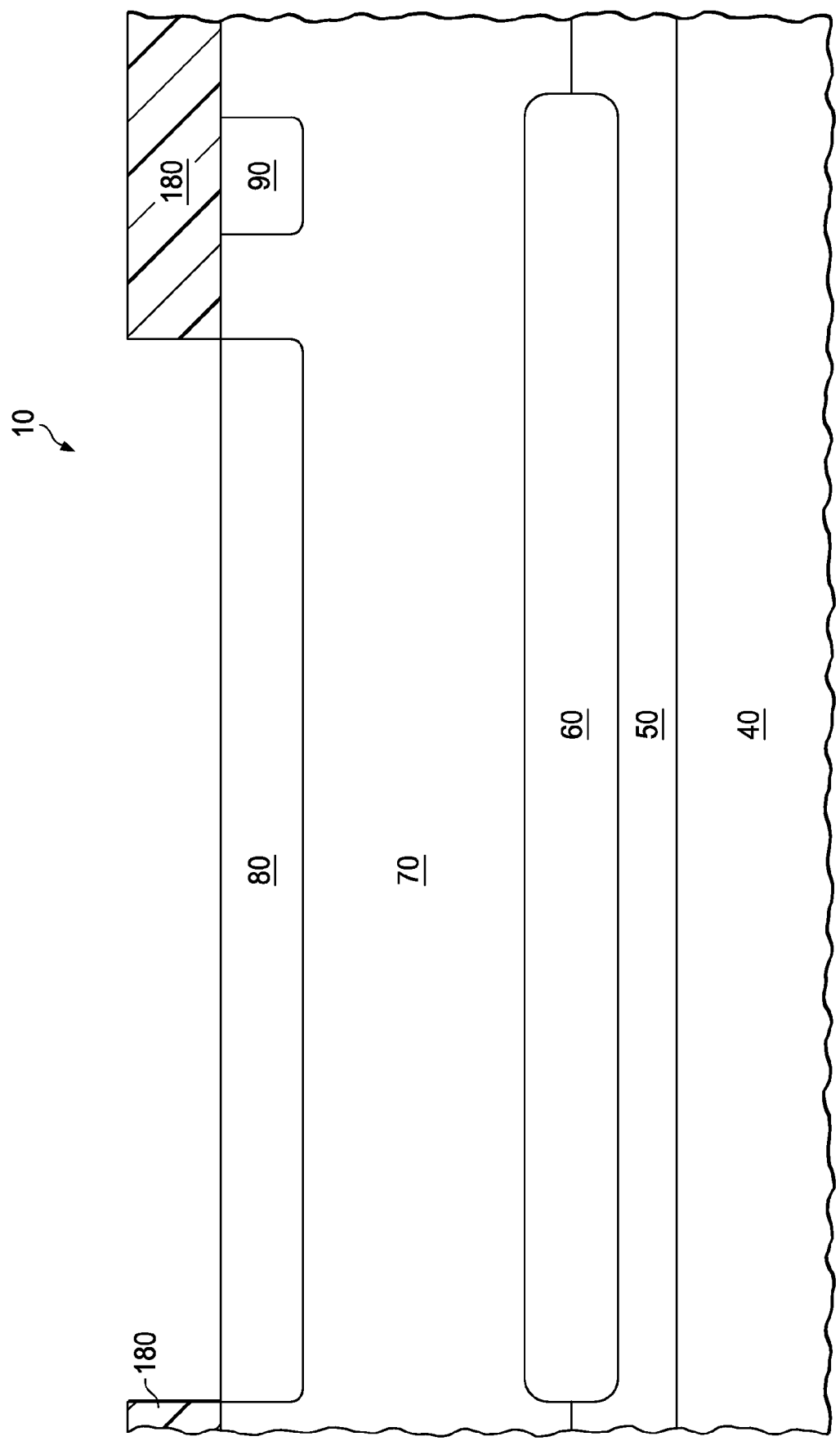
Figure 5F:
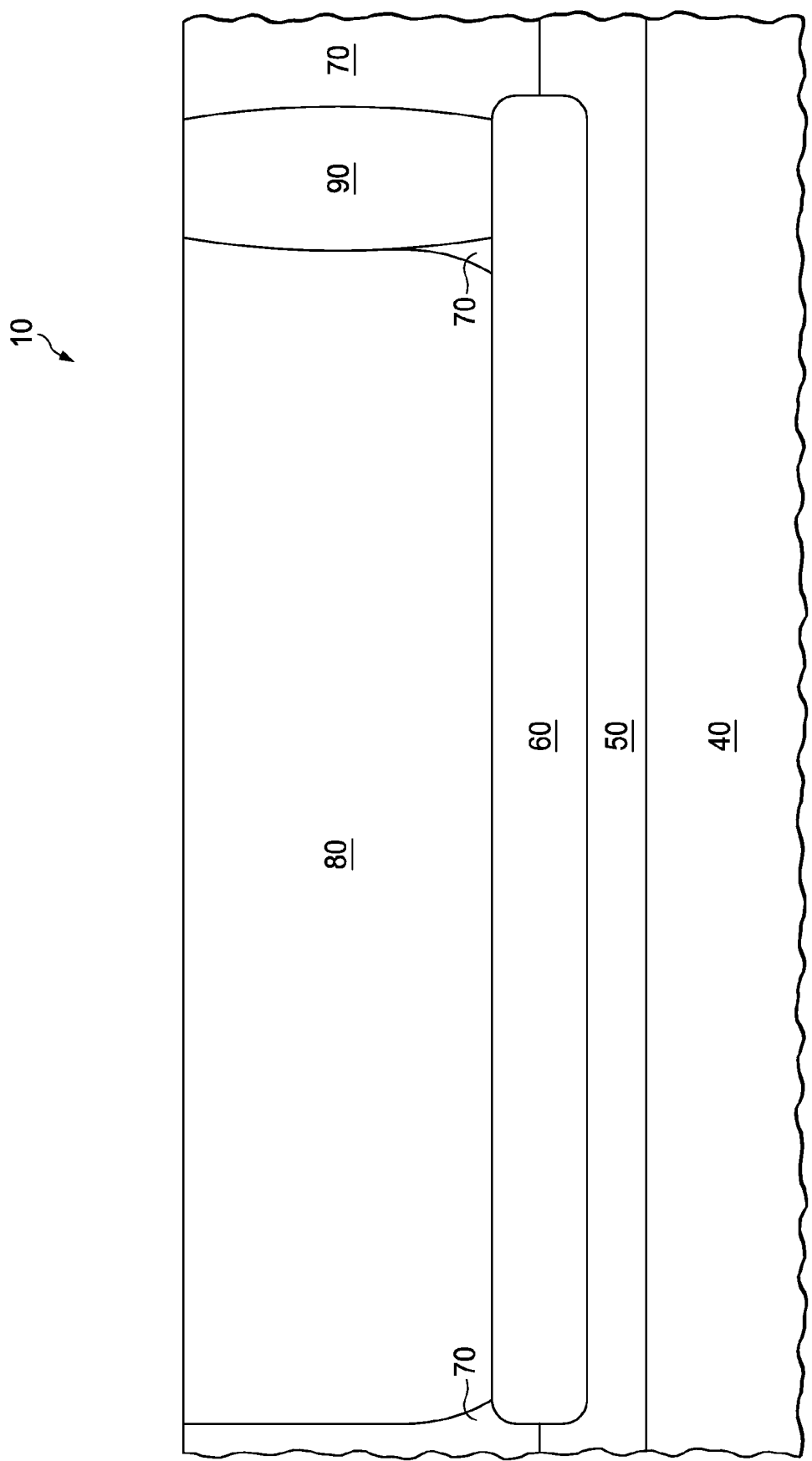
Figure 5G:
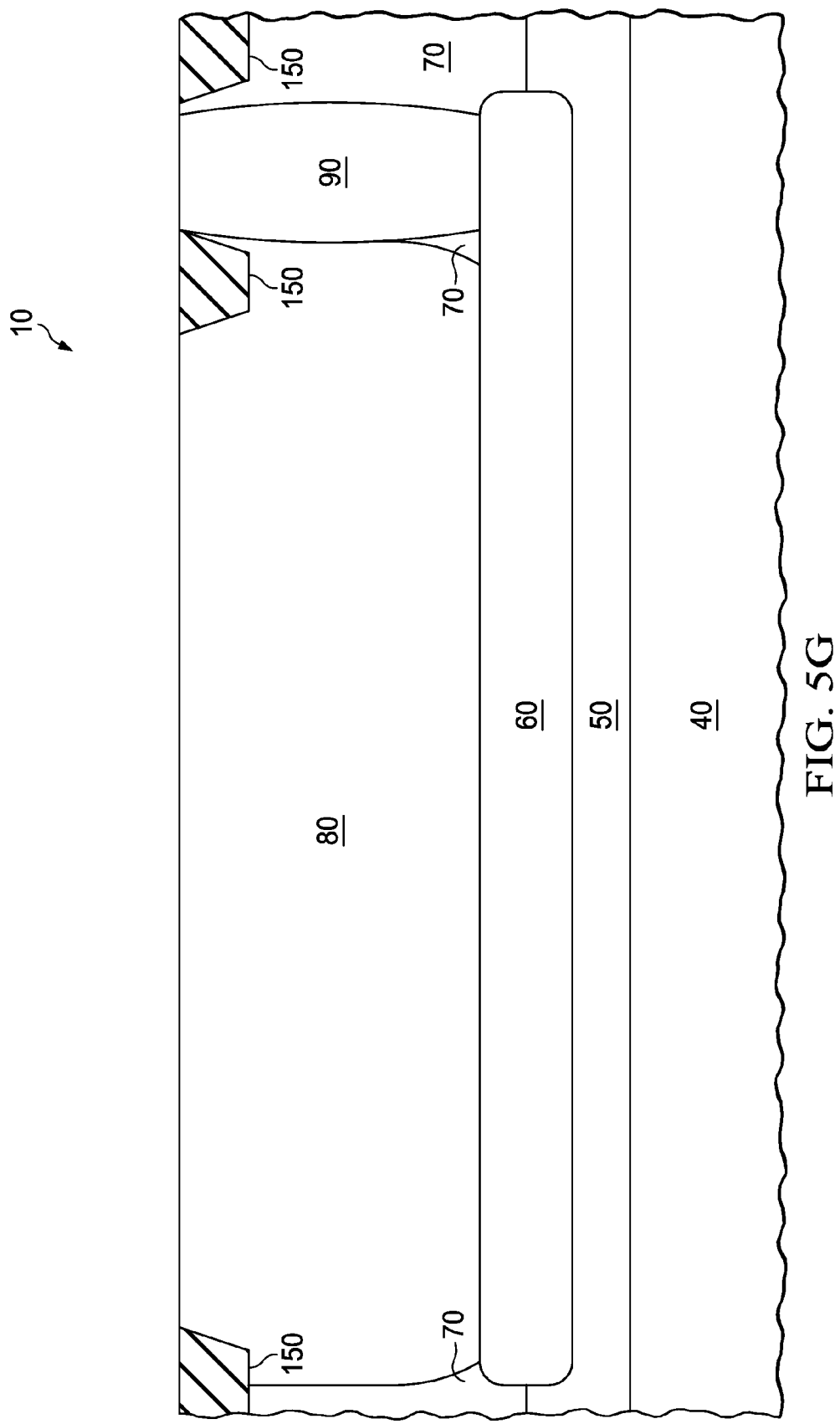
Figure 5H:
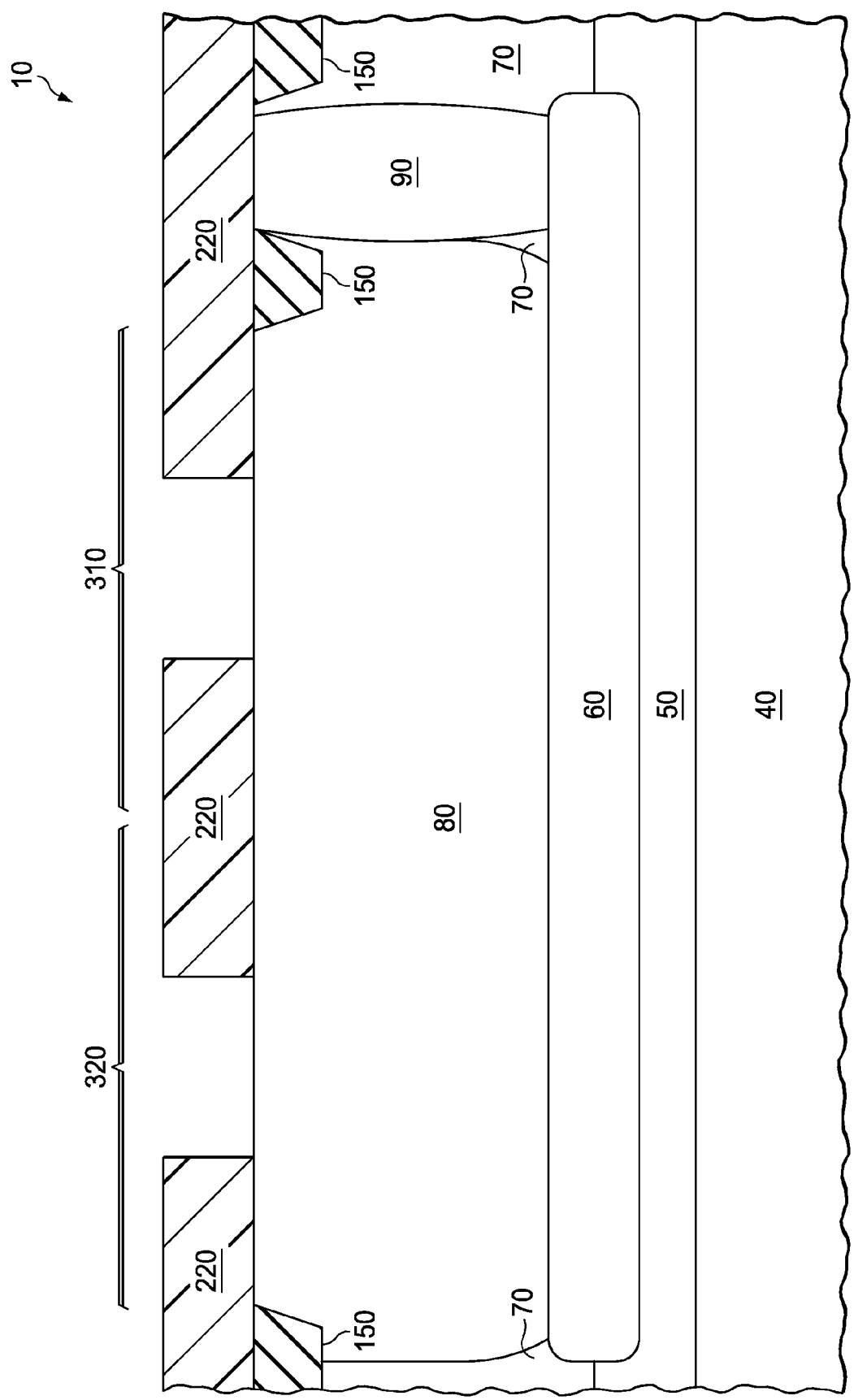
Figure 5I:
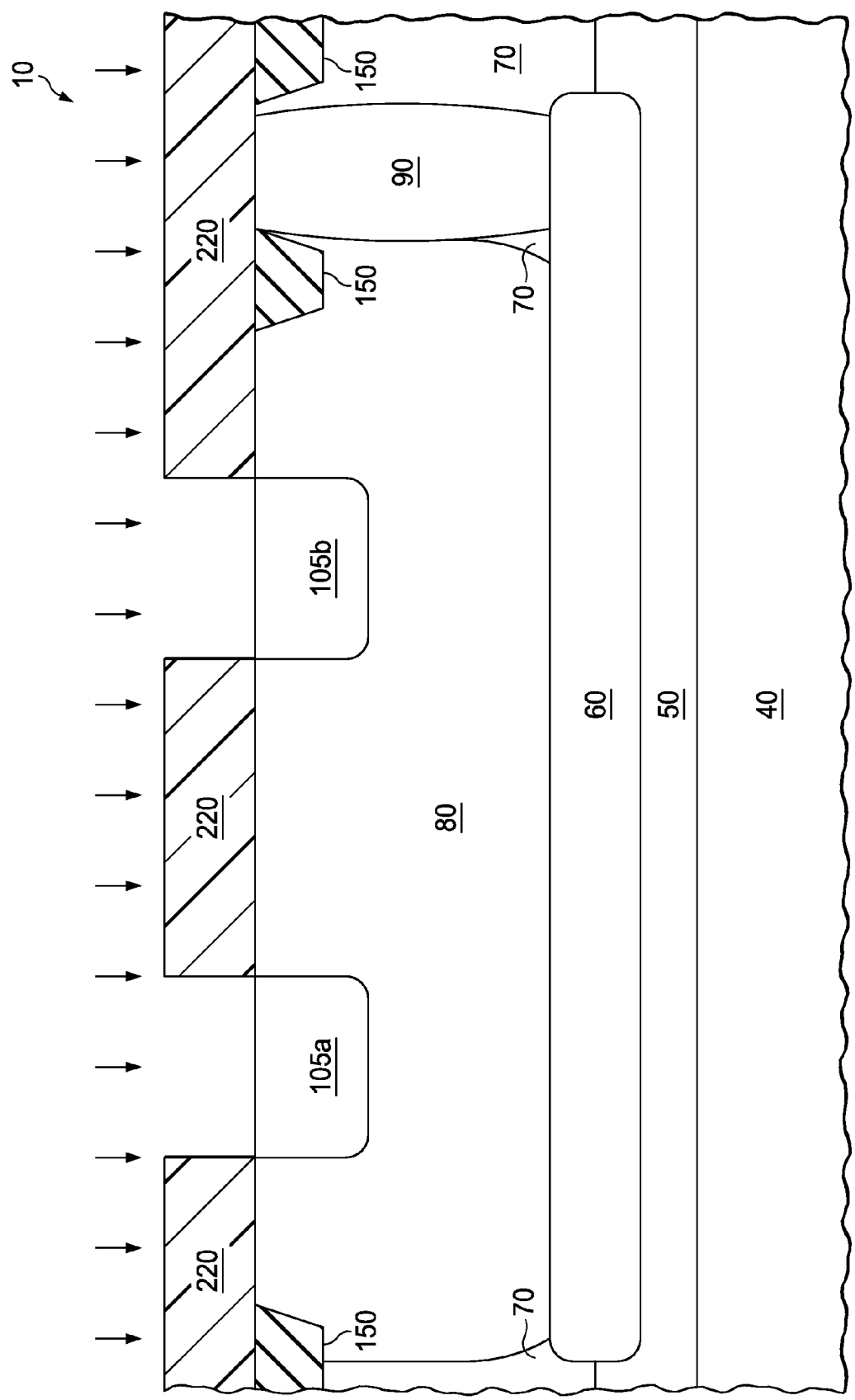
Figure 5J:
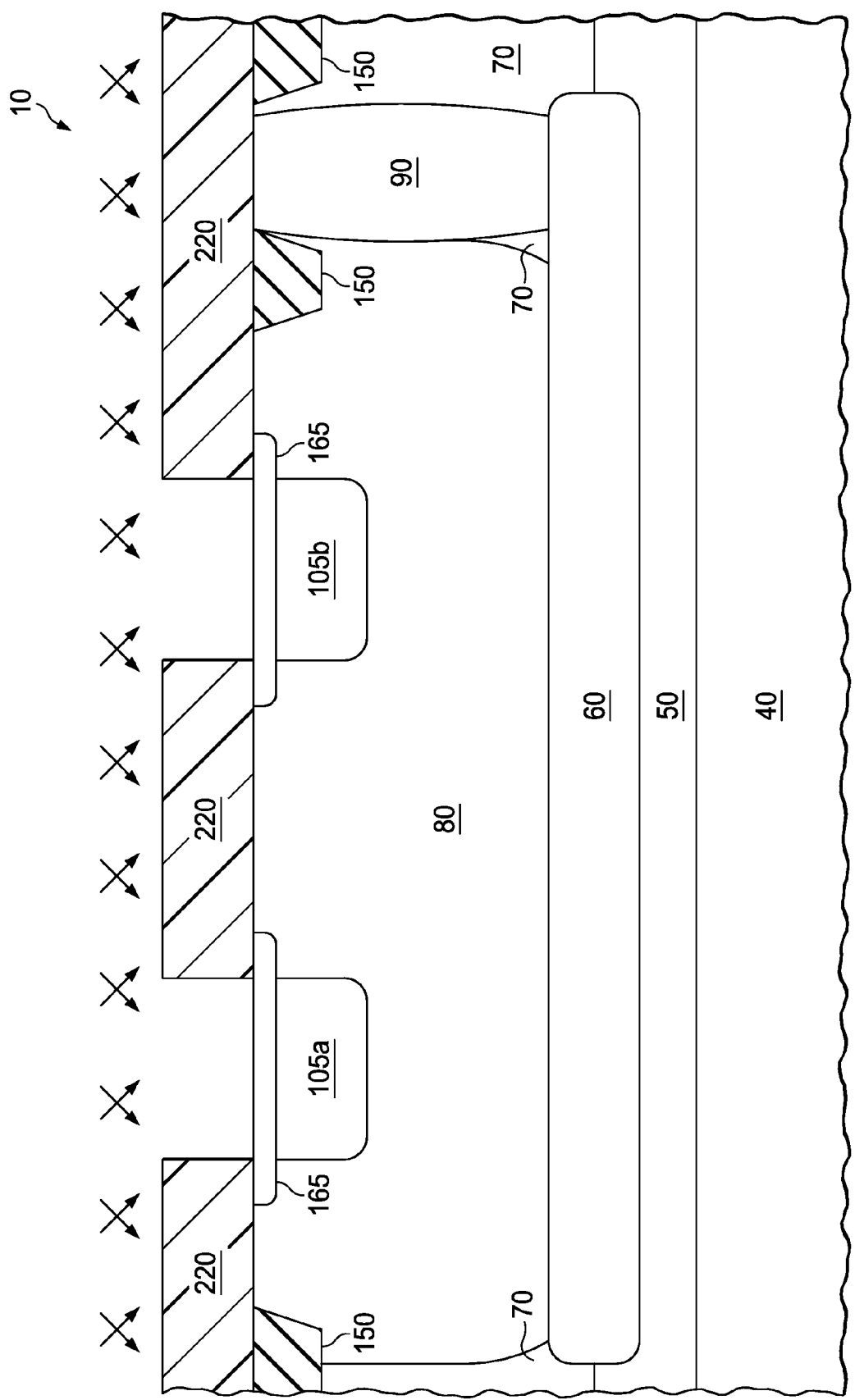
Figure 5K:
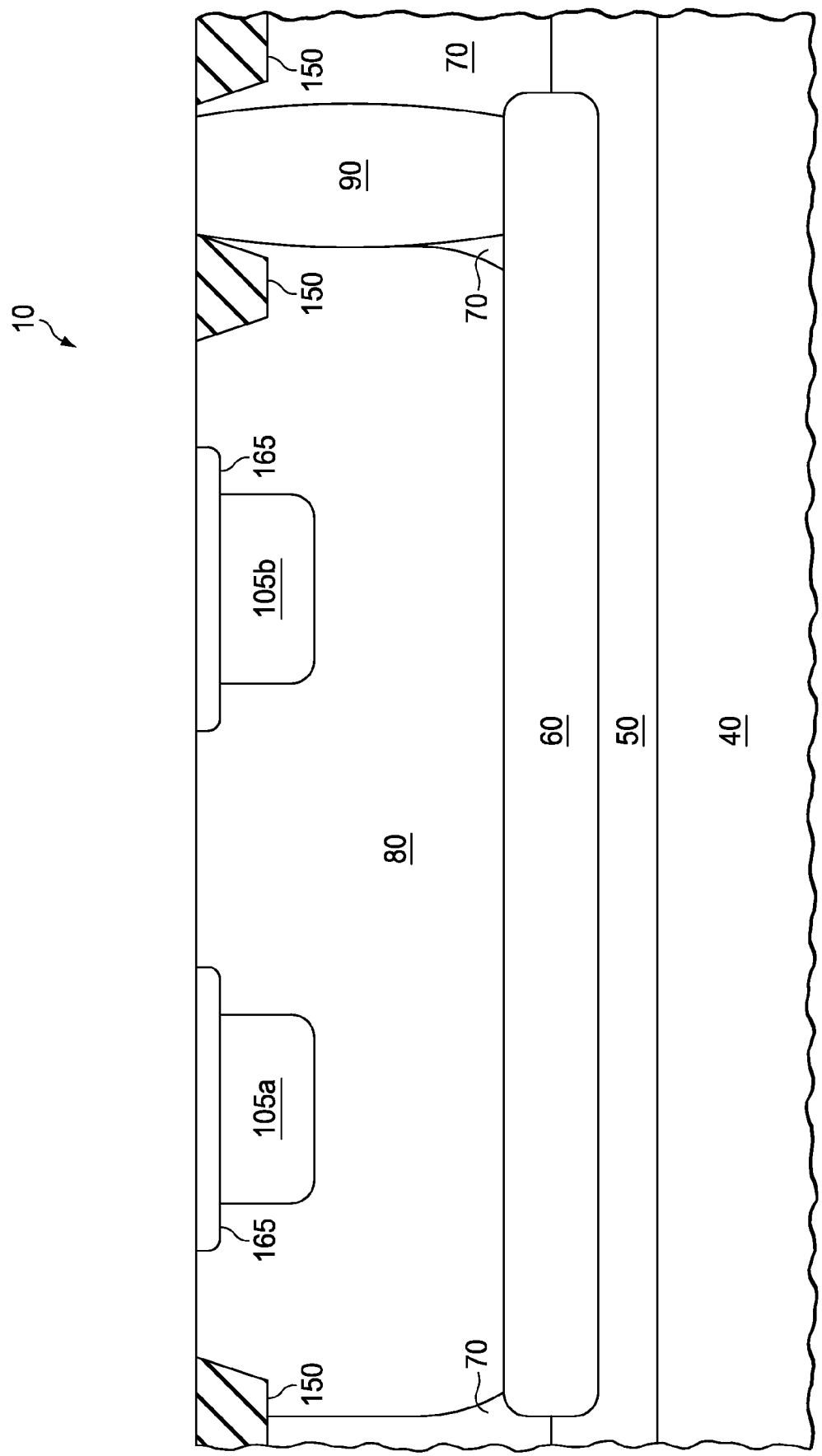
Figure 5L:
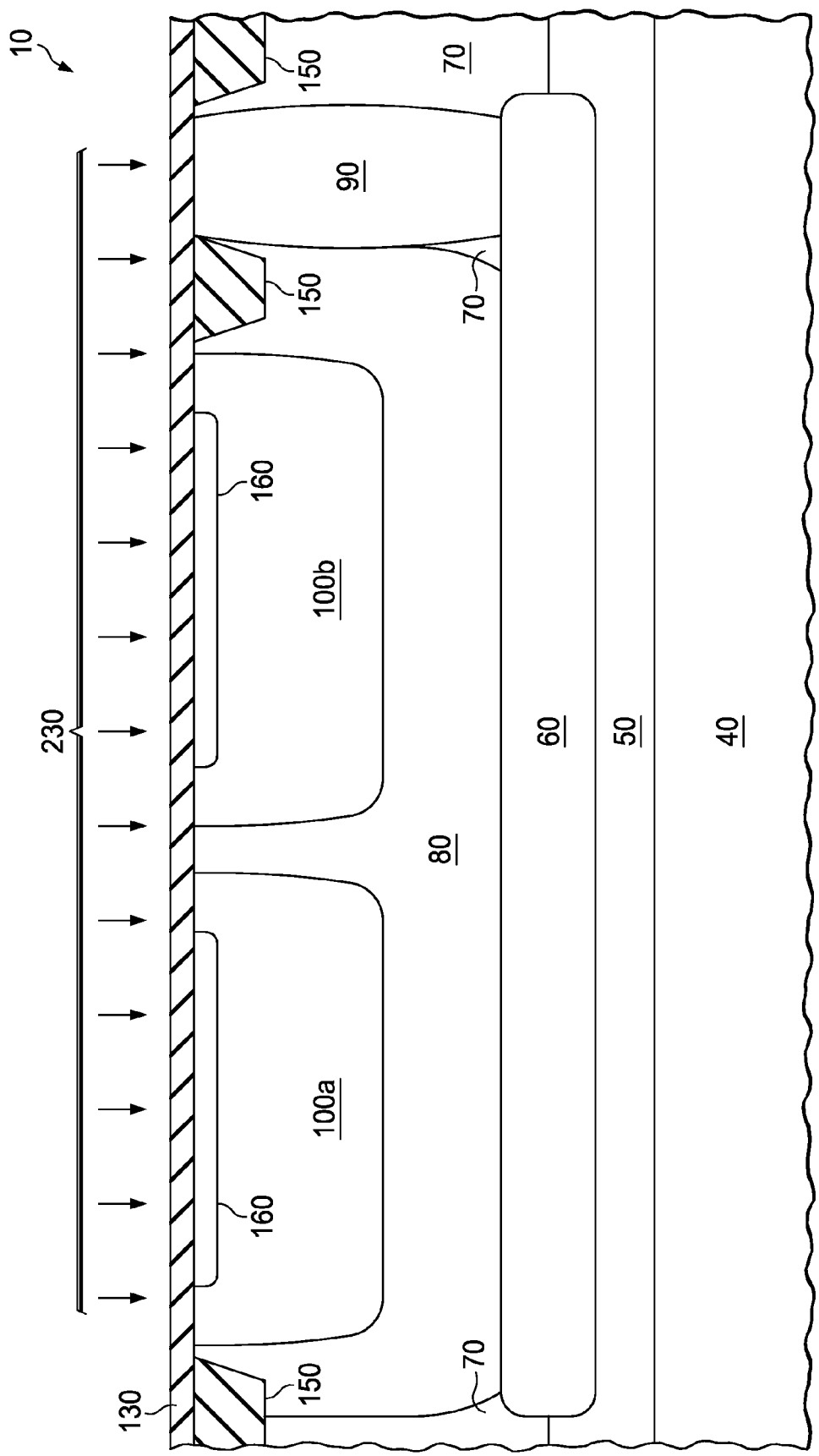
Figure 5M:
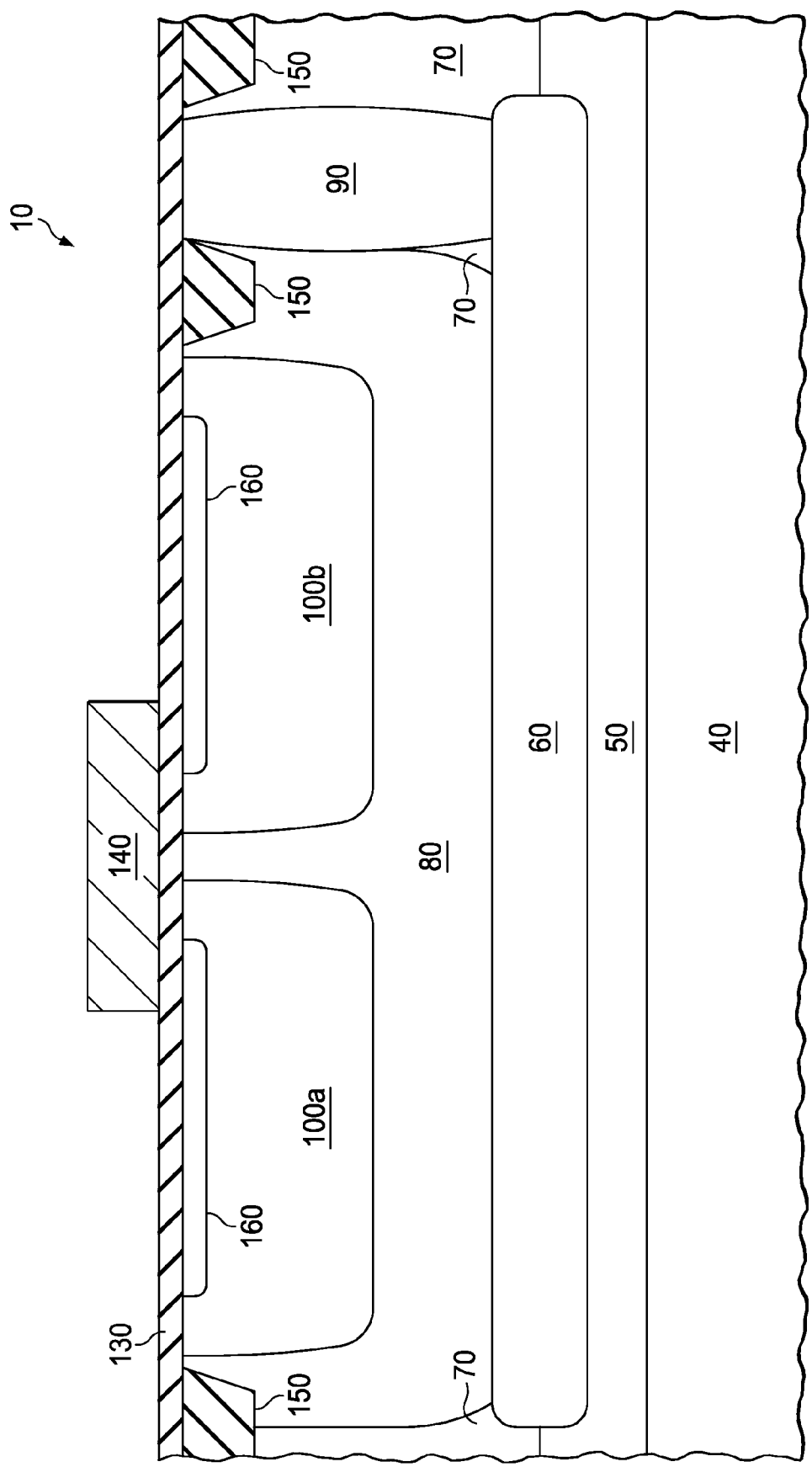
Figure 5N:
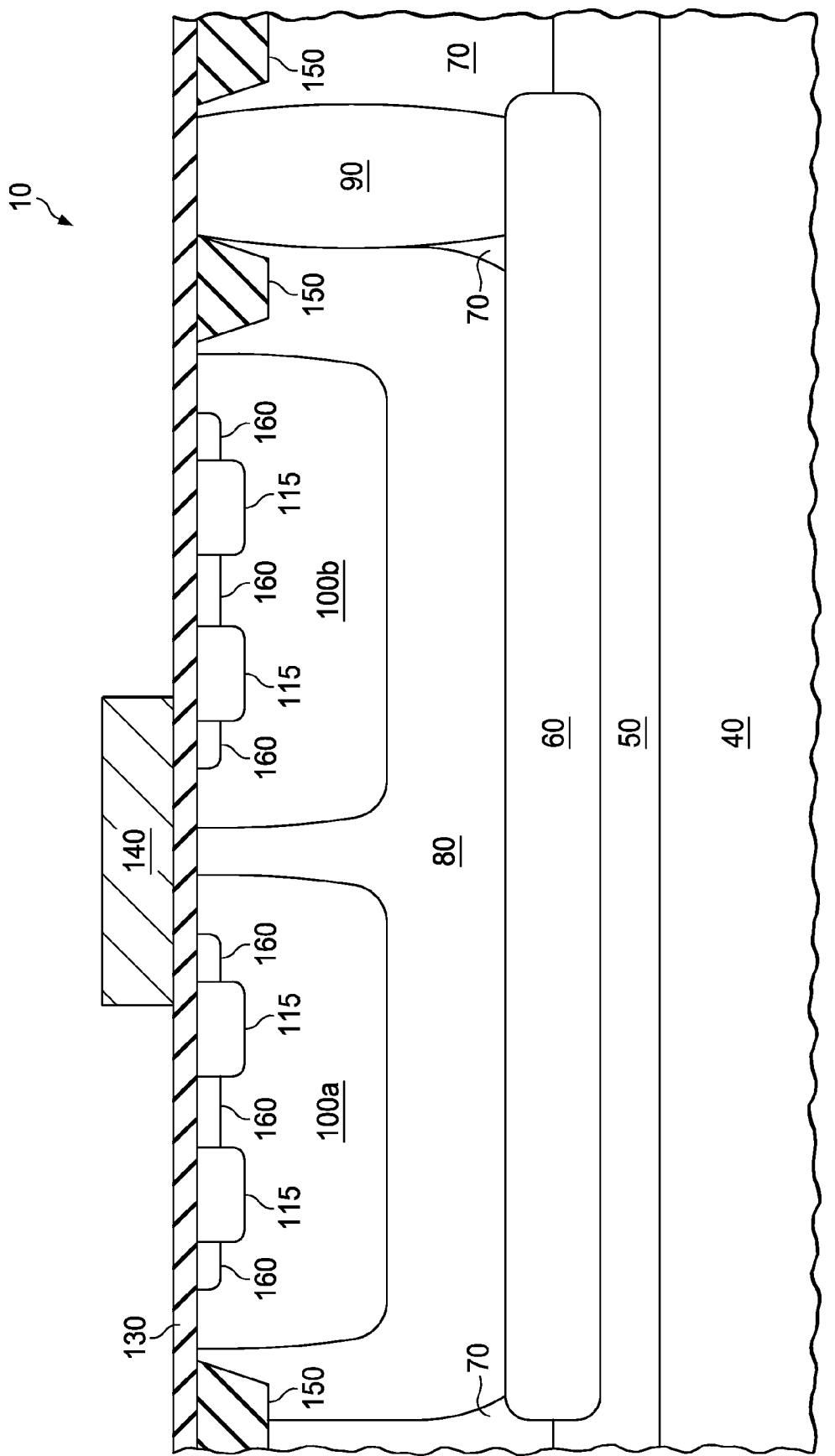
Figure 5O:
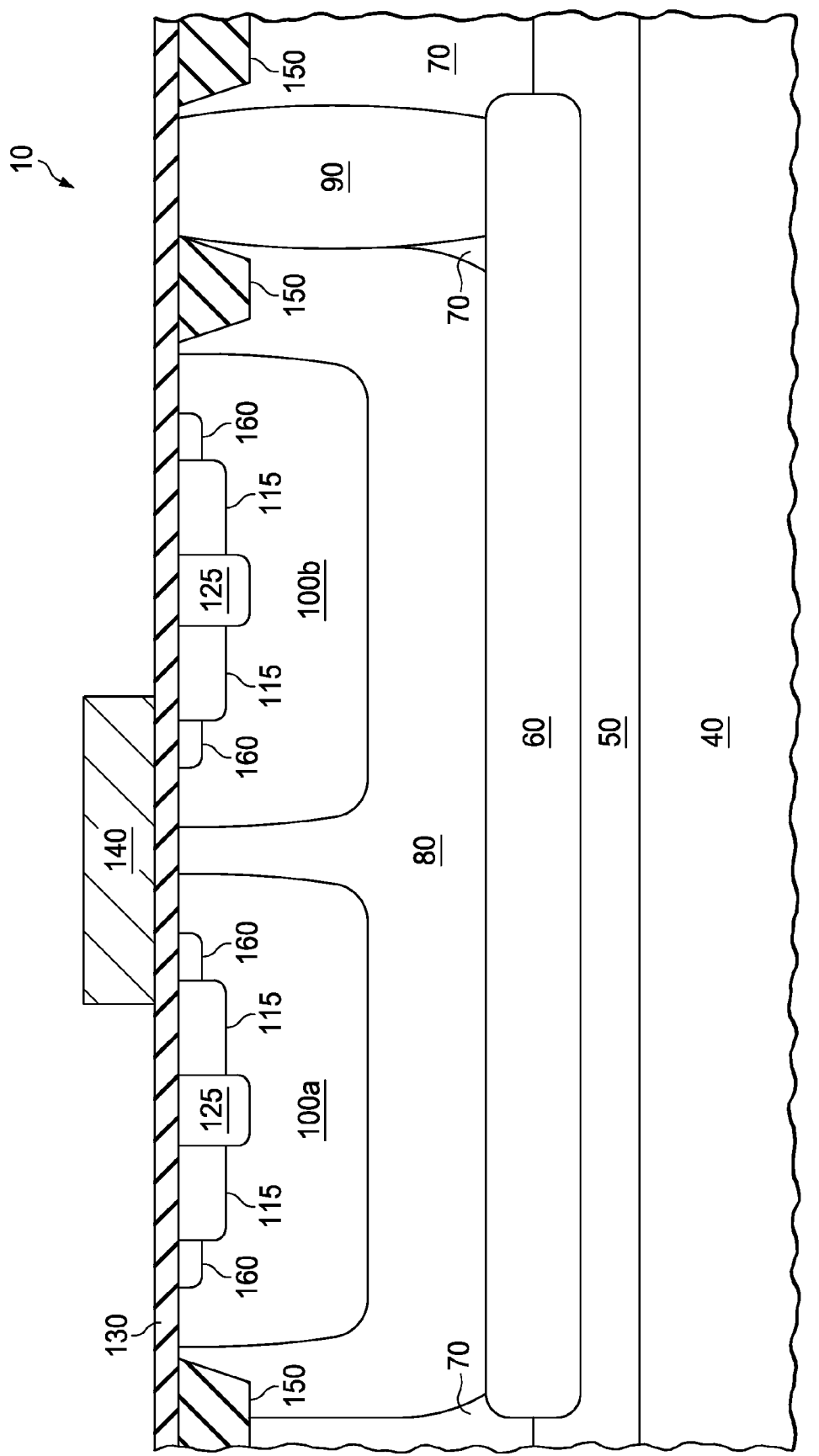

Referring again to the drawings, FIGS. 5A-5O are cross-sectional views of a partially fabricated semiconductor wafer 10 illustrating a process for forming the example VDMOS transistor 300 of FIG. 2 in accordance with the present invention. The process for forming an example VDMOS transistor 300 is similar to the process for process for forming the example LDMOS transistors 20, 30 described supra; therefore much of the redundant process detail is omitted infra.

FIG. 5A is a cross-sectional view of the semiconductor wafer 10 after the implantation of n-type dopants for the n-buried layer 60 into a first p-type doped epitaxial layer 50 using a patterned photoresist mask 180. In the example application, the semiconductor wafer is a p⁺-type substrate 40. Once the implantation process is complete, the patterned photoresist 180 is removed with a standard ash and clean process, as shown in FIG. 5B. As also shown in FIG. 5B, a thermal process is then used to diffuse the dopants and drive the n-buried layer 60 further into the first epi layer 50.

Next, as shown in FIG. 5C, a second p-type epitaxial layer 70 is grown over the top of the semiconductor wafer 10 with any standard process. During this process, the n-buried layer 60 will diffuse into the second layer of epi 70.

Another patterned photoresist 180 is now used to direct the implantation of n-type dopants into the location of the deep n-type sinker 90. Any suitable processes may be used for this implantation step shown in FIG. 5D. The patterned photoresist 180 is then removed with a standard ash and clean process.

FIG. 5E is a cross-sectional view of the semiconductor wafer 10 after the Implantation of the n-well 80 within the semiconductor wafer 10 using any standard process and a patterned photoresist 180. Once the n-well 80 is implanted, the patterned photoresist 180 is then removed with a standard ash and clean process. Then, as shown in 5F, a standard thermal process is used to drive the n-well 80 and the deep n-type sinker 90 further into the second layer of epi 70 until they contact the n-buried layer 60. As shown in FIG. 5G, the isolation regions 150 are then formed within the surface of the n-well 80 using any suitable process.

A patterned photoresist 220 is now used as a mask for the implantation of p-type dopants and n-type dopants into the n-well 80. As shown in FIG. 5H, a layer of standard photoresist material is formed over the semiconductor wafer 10 and then etched to form a patterned photoresist 220 that exposes the n-well 80 at the targeted location for the two-part source (i.e. elements 310 and 320 of FIG. 2) of the VDMOS transistor 300.

In accordance with the example embodiment, p-type dopants are now implanted into the n-well 80, as shown in FIG. 5I. The p-type dopant is B; however, another p-type dopant (i.e. $BF_2$) or any combination of dopants may be used. In addition, any suitable mid-current or high-current machine may be used to form the p-type implants 105a, 105b. Moreover, the p-type implantation process may use any suitable dose between $5e^{13}$-$5e^{14}$ and any suitable energy between 50 KeV and 400 KeV. The p-type dopants are implanted at a normal angle; however, it is within the scope of the invention to implant the p-type dopants into the n-well 80 with an angled implant process.

Next, n-type dopants 165 are implanted into the n-well 80 with an in-situ process, either in the same chamber or a different chamber. The n-type dopant is As; however, another n-type dopant (i.e. P or Sb) or any combination of dopants may be used. The n-type implantation process may use any suitable dose between $6e^{13}$-$3e^{14}$ and any suitable energy between 120 KeV and 180 KeV. In accordance with the example embodiment, the n-type dopants are implanted at an angle that forms implant regions 165 having an outer boundary that extends laterally past the outer boundary of the p-type implant regions 105a, 105b, as shown in FIG. 5J. The implantation angle of the n-type implant may be up to 25° greater than the implantation angle of the p-type implant. For example, if the p-type implants 105a, 105b are formed using an implant angle of 5°, than the n-type implants 165 may be formed using an implant angle of 30°. It is within the scope of the invention to rotate the wafer during the n-type implantation process (FIG. 5J) to form the desired n-type implant region shapes 165. (It is to be noted that the wafer may also be rotated during the p-type implants 105a, 105b if they also use an angled implant.) Upon completion of the implantation processes for the p-type dopants 105a, 105b and n-type dopants 165, the patterned photoresist 220 is removed, as shown in FIG. 5K.

It is to be noted that the p-type implant regions 105a, 105b and the n-type implant regions 165 were formed using the same mask 220. Therefore, they are self-aligned (i.e. co-implanted). It is also within the scope of the invention to change the order of the co-implantation steps and form the n-type implant regions 165 before the p-type implant regions 105a, 105b.

Figure 6A:
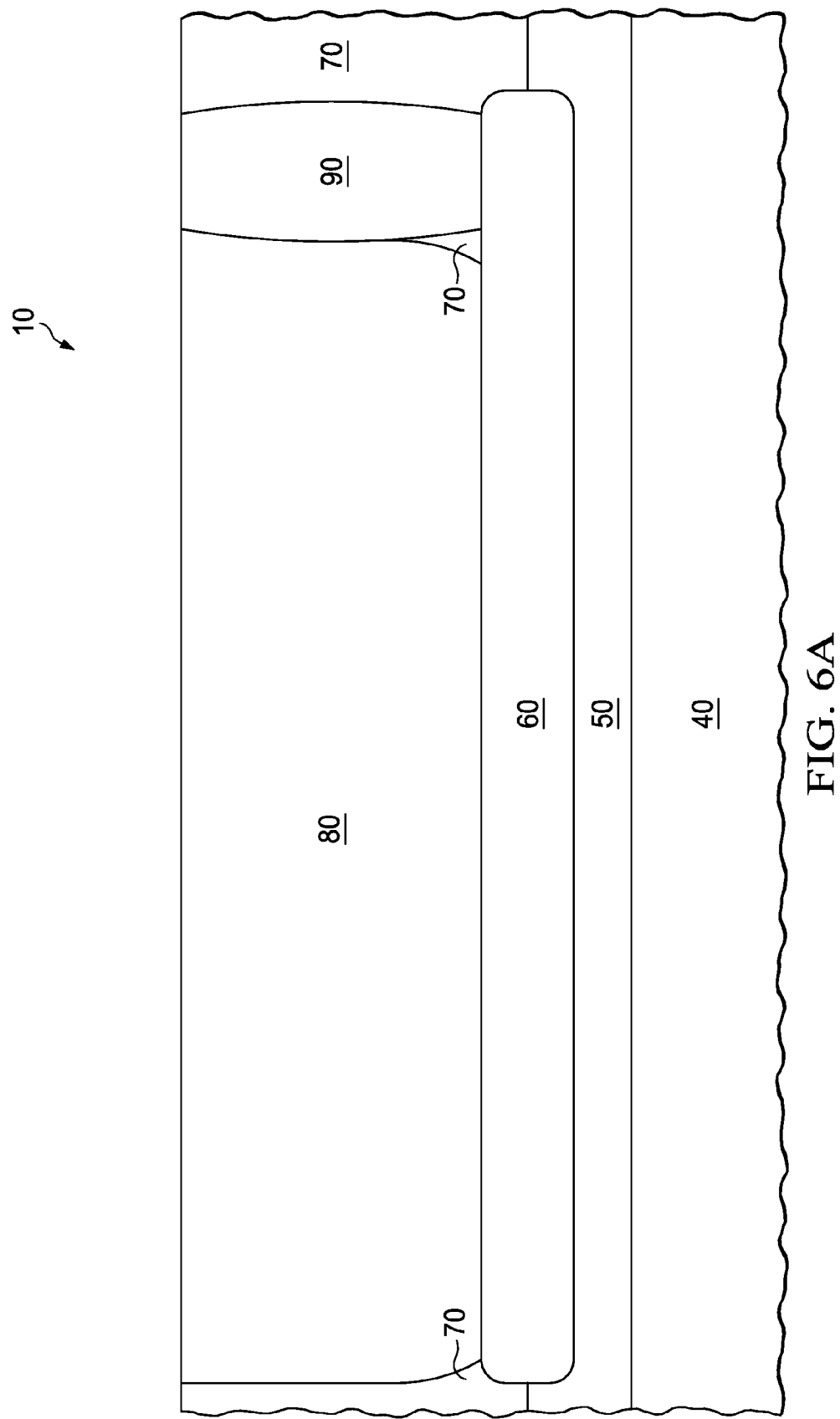
FIGS. 6A-6F are cross-sectional diagrams of a portion of a process for forming a VDMOS in accordance with an alternative embodiment of the invention.
Figure 6B:
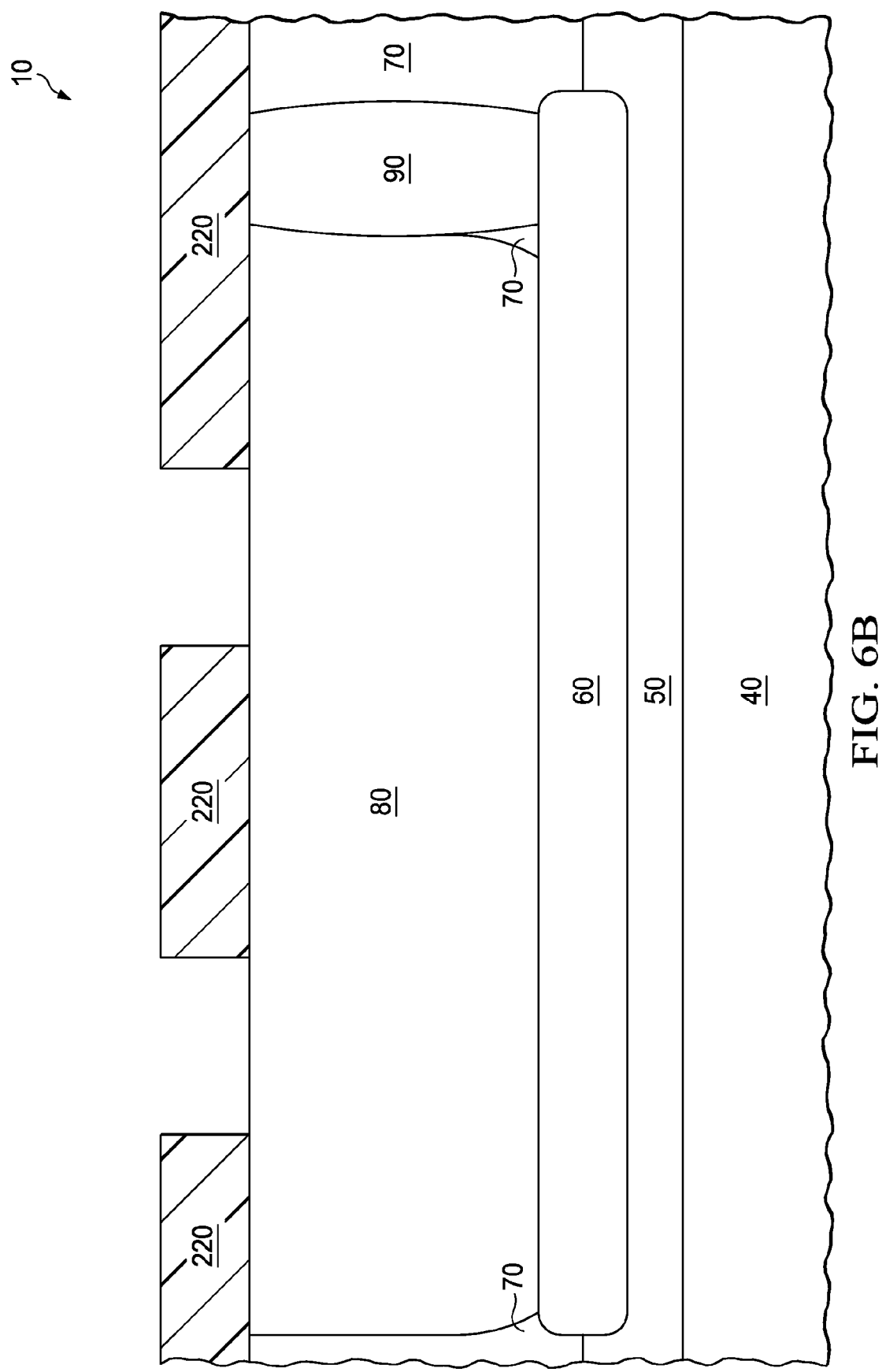

Moreover, instead of forming the isolation regions 150 before the p-type implants 105a, 105b and the n-type implants 165 as discussed supra, the isolation regions may be formed after the p-type implants 105a, 105b and the n-type implants 165 using an alternative process flow, as shown in FIGS. 6A-6F. As shown in FIG. 6A, the semiconductor wafer 10 containing an n-well 80 of the alternative embodiment is similar to the semiconductor wafer 10 containing an n-well 80 of the example embodiment shown in FIG. 5F. A patterned photoresist 220 is now used as a mask for the implantation of p-type dopants and n-type dopants into the n-well 80, as shown in FIG. 6B.

Figure 6C:
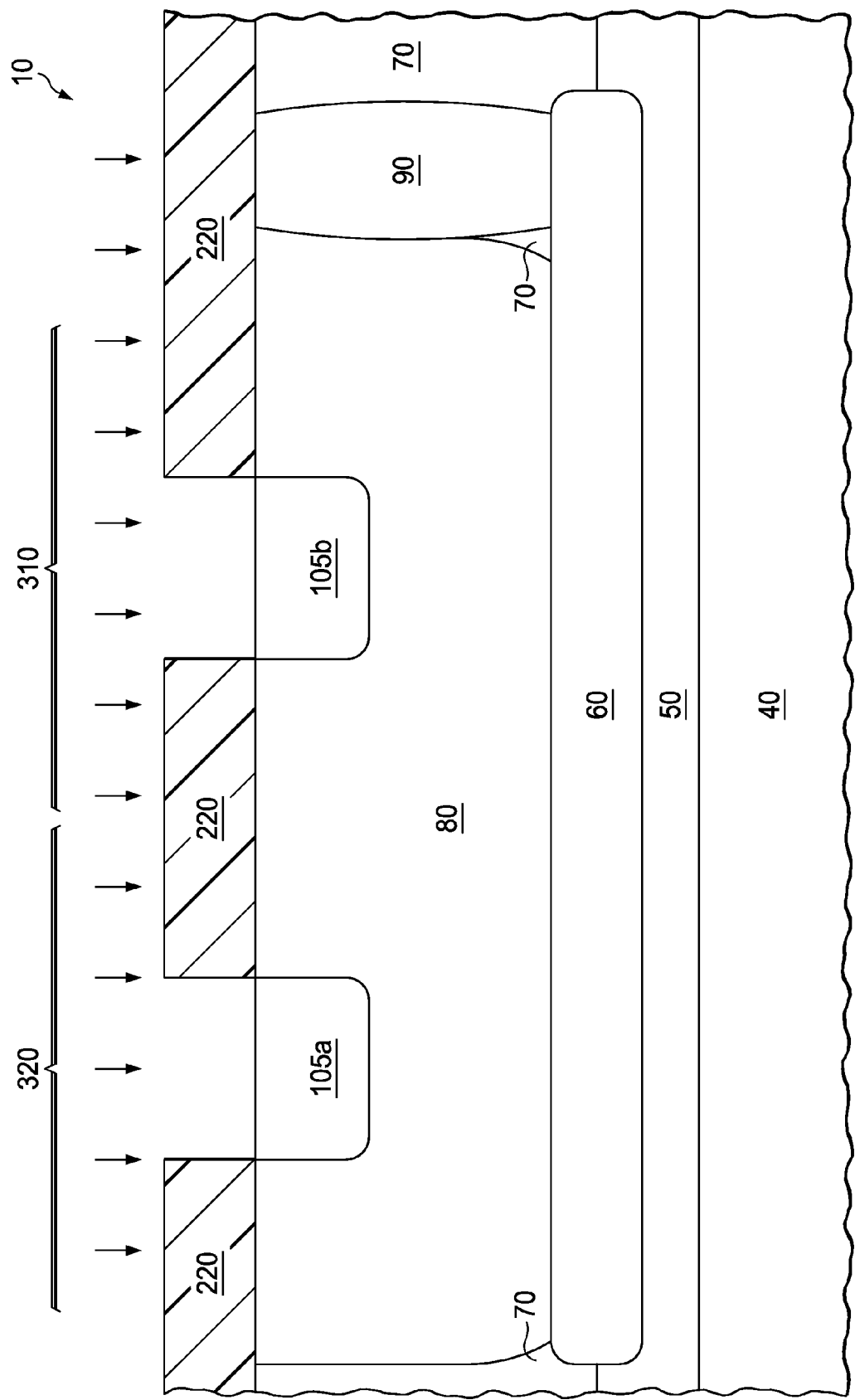

In accordance with the alternative embodiment, p-type dopants are now implanted into the n-well 80, as shown in FIG. 6C. The p-type dopant is B; however, another p-type dopant or combination of dopants may be used. In addition, any suitable mid-current or high-current machine may be used to form the p-type implants 105a, 105b. Furthermore, the p-type implantation process may use any suitable dose between $5e^{13}$-$5e^{14}$ and any suitable energy between 50 KeV and 400 KeV. The p-type dopants 105a, 105b are implanted at a normal angle (i.e. close to 0°); however, it is within the scope of the invention to implant the p-type dopants into the n-well 80 with an angled implant process.

Figure 6D:
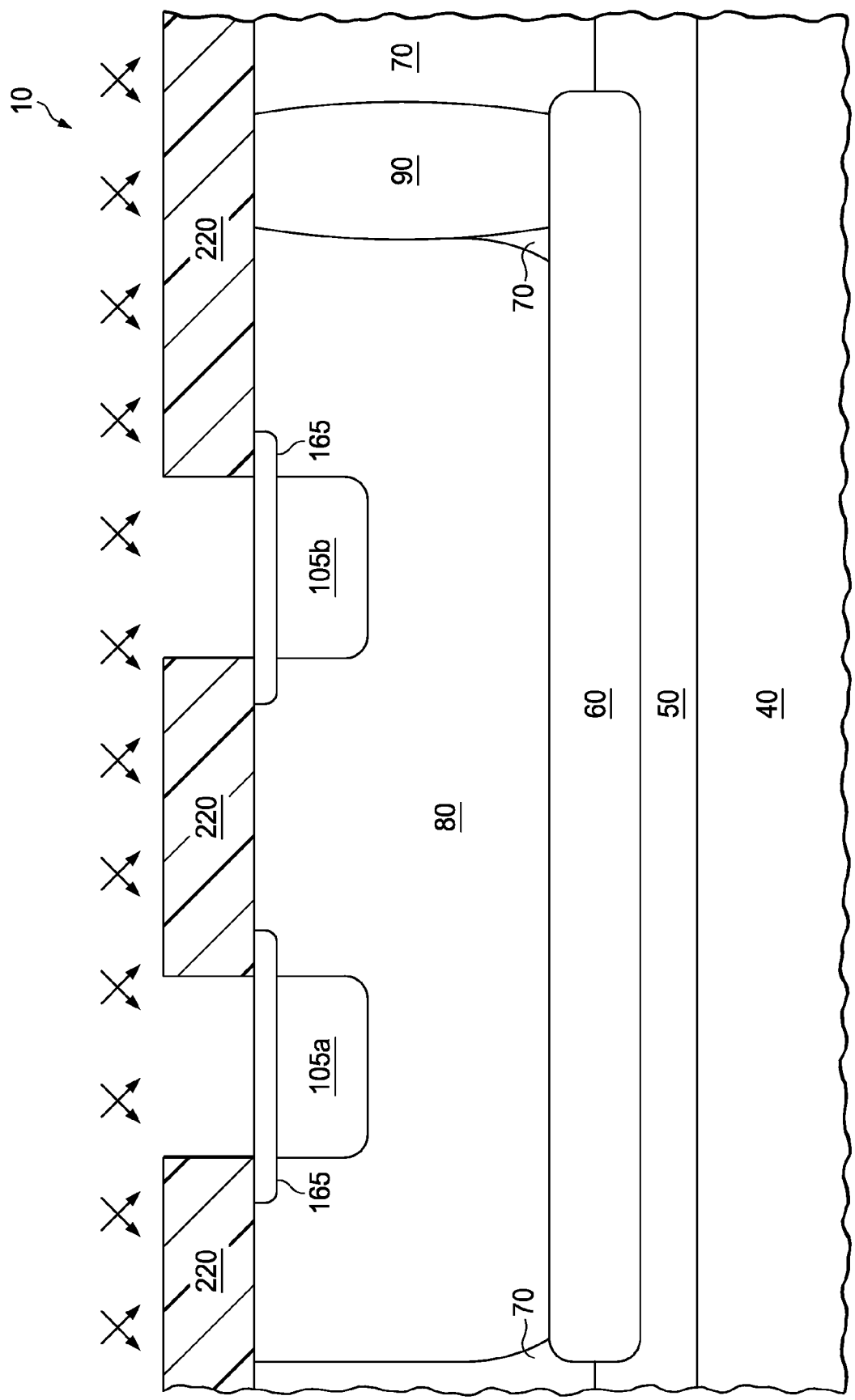
Figure 6E:
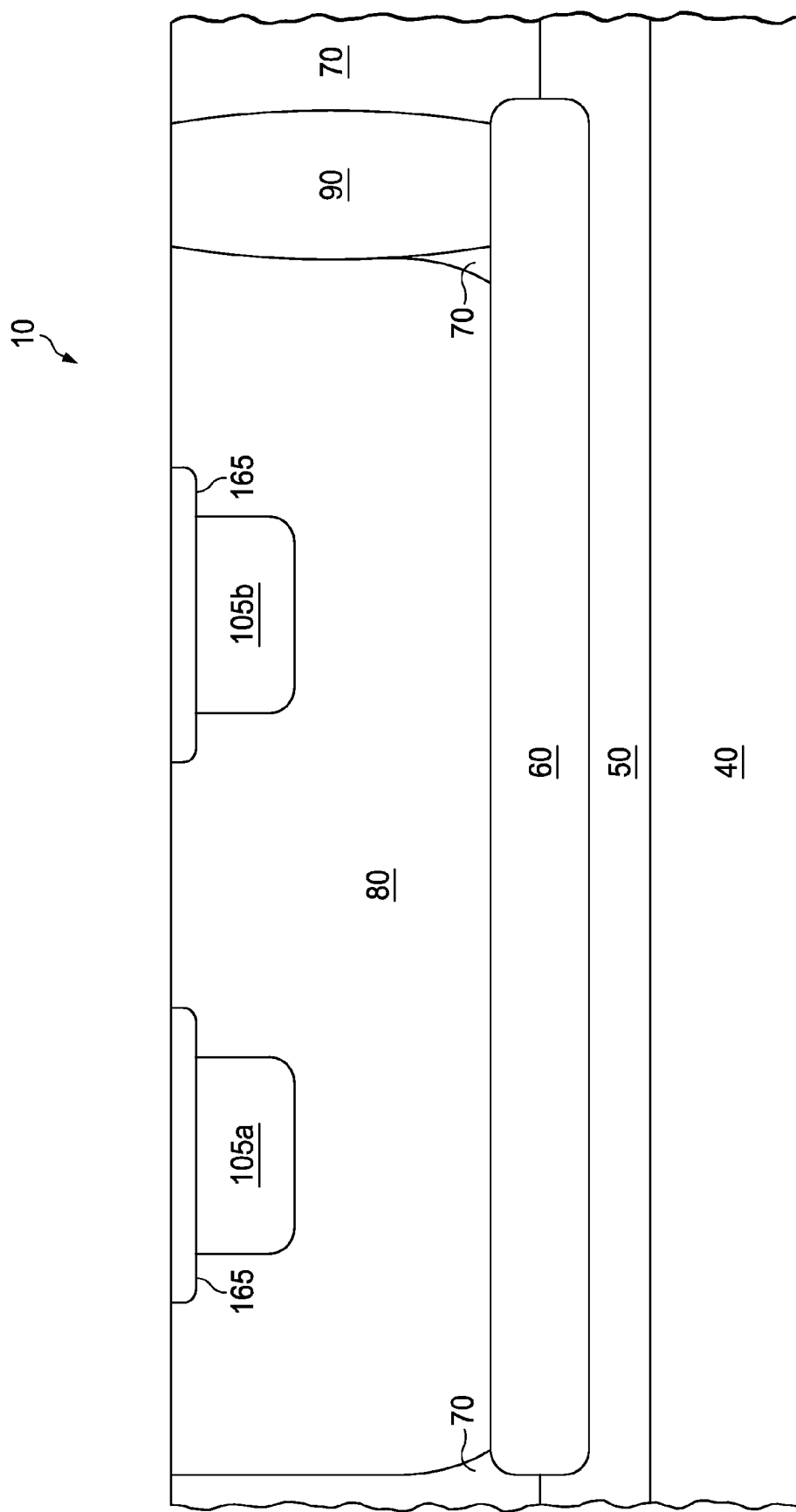

The implantation of n-type dopants 165 into the n-well 80 is performed in-situ, either in the same chamber or a different chamber. The n-type dopant is As; however, another n-type dopant or combination of dopants may be used. The n-type implantation process may use any suitable dose between $6e^{13}$-$3e^{14}$ and any suitable energy between 120 KeV and 180 KeV. In accordance with the alternative embodiment, the n-type dopants are implanted at an angle that forms implant regions 165 having an outer boundary that extends laterally past the outer boundary of the p-type implant regions 105a, 105b, as shown in FIG. 6D. The implantation angle of the n-type implant may be up to 25° greater than the implantation angle of the p-type implant. For example, if the p-type implants 105a, 105b are formed using an implant angle of 5°, than the n-type implants 165 may be formed using an implant angle of 30°. It is within the scope of the invention to rotate the wafer during the n-type implantation process to form the desired n-type implant region shapes 165. (It is to be noted that the wafer may also be rotated during the p-type implants 105a, 105b if they also use an angled implant.) Upon completion of the implantation processes for the p-type dopant regions 105a, 105b and n-type dopant regions 165, the patterned photoresist 220 is removed with a standard ash and clean process, as shown in FIG. 6E.

Figure 6F:
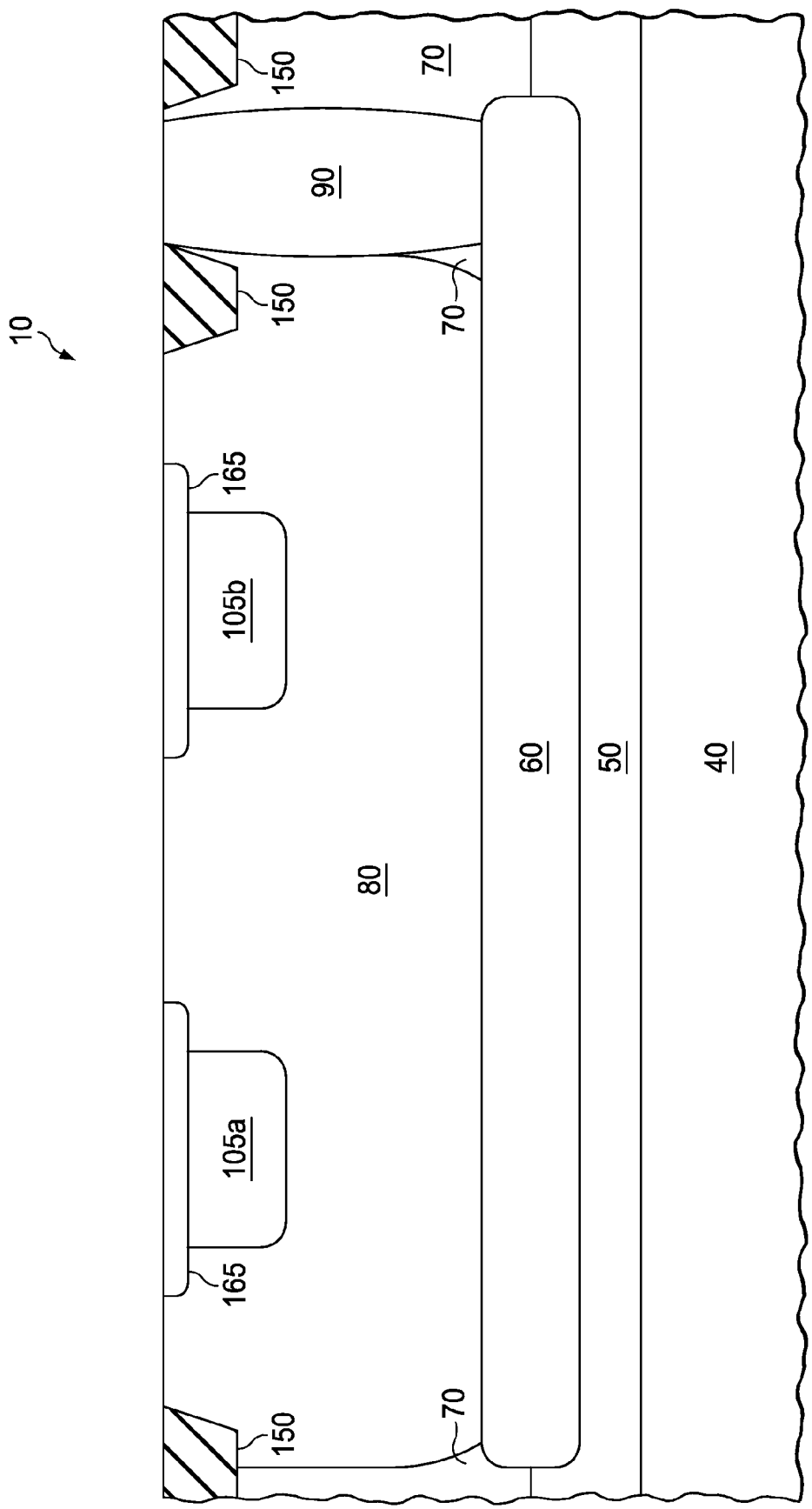

It is to be noted that the p-type implants 105a, 105b and the n-type implants 165 were formed using the same mask. Therefore, they are self-aligned. It is also to be noted that the n-type implant region 165 may be formed before the p-type implant regions 105a, 105b. Isolation regions 150 are now formed within the surface of the n-well 80 using any suitable process, as shown in FIG. 6F.

The next step in the fabrication of the semiconductor wafer 10 (for both the example embodiment and the alternative embodiment described supra) is a suitable standard thermal process that diffuses the dopants within the p-type implants 105a, 105b and the n-type implants 165. The thermal process also forms a gate dielectric layer 130. (However, the growth of the dielectric layer 130 over the isolations regions 150 will be impeded.) As shown in FIG. 5L, the thermal oxidation process 230 also facilitates the diffusion of the p-type implants 105a, 105b and the n-type implants 165 laterally and vertically, forming the respective first and second p-body regions 100a, 100b and the n-type regions 160 of the VDMOS transistor 300.

The VDMOS transistor 300 that is formed with the fabrication processes of the example embodiment and the alternative embodiment have a high level of B doping within the first and second p-body regions 100a, 100b to maximize robustness (i.e. the on-state breakdown voltage $B_{von}$). In addition, the targeted threshold voltage $V_t$ is realized by the angled implant that is used to form the n-type regions 160 that are present within the p-body regions 100a, 100b (which acts to reduce $V_t$). Moreover, the angled n-type implant (FIGS. 5J and 6D) compensates some of the peak p-type implant near the surface of the transistor channels but does not compensate the p-type implant in the depth region that is located away from the transistor channels. Thus, a lower threshold voltage ($V_t$) is achieved without compromising the robustness ($BV_{on}$) of the device.

Standard process steps are now performed to complete the structure of the VDMOS transistor 300. In the example application, the gate electrode 140 of VDMOS transistor 300 is formed by any suitable process, as shown in FIG. 5M. Next, standard manufacturing processes are used to complete the formation of the first and second source regions (i.e. elements 310 and 320 of FIG. 2) within the n-well 80 of VDMOS transistor 300, as shown in FIG. 5N. The first step is the formation of the $n^+$-type dopant regions 115 for the first and second source regions 310, 320. This first step includes the use of a patterned mask (not shown) and a standard implant process to deposit a high concentration of n-type dopants, thereby forming the $n^+$-type dopant regions 115. (It is to be noted that the $n^+$-type dopants in region 115 will overwhelm the previously implanted n-type dopants of region 160 at the same location.)

Then, another standard implant process (using another patterned mask) is used to deposit a high concentration of p-type dopants 125, as shown in FIG. 5O. The $p^+$-type dopant region 125 and the $n^+$-type dopant regions 115 are then activated by any suitable anneal process. This anneal step will likely cause the lateral migration of the $p^+$-type dopants 125 and the $n^+$-type dopants 115, resulting in the respective $p^+$-type dopant regions 120 and the $n^+$-type dopant regions 110 shown in FIG. 2. (It is to be noted that the $p^+$-type dopants in region 120 will overwhelm the previously implanted n-type dopants of region 160 at the same location.) The fabrication of the semiconductor wafer 10 now continues (using standard process steps) until the semiconductor device is complete.

Various additional modifications to the invention as described above are within the scope of the claimed invention. As an example, interfacial layers may be formed between any of the layers shown. In addition, any of the implant processes may be followed by a post ion implantation clean. Furthermore, an anneal process may be performed after any step in the above-described fabrication process. When used, the anneal process can improve the microstructure of materials and thereby improve the quality of the semiconductor structure. Additionally, the $p^+$-type dopant region within the source of the LDMOS may be implanted before the implantation of the $n^+$-type dopant regions of the source and drain. (Similarly, the $p^+$-type dopants of the two-part source of the VDMOS may be implanted before the implantation if the $n^+$-type dopants of the two-part source.)

Moreover, instead of using this invention in n-channel LDMOS and VDMOS transistors, the invention may also be used in p-channel LDMOS and VDMOS transistors. In the alternative p-channel LDMOS and VDMOS transistor embodiments, each of the dopant polarities described supra would be reversed. For example, the co-implant steps (FIGS. 3D-3E, 4C-4D, 5I-5J, 6C-6D) would include a normal (or close to normal degree) n-type implant of P plus an angled p-type implant of indium ("In"). (It is preferable that the p-type implant diffuses less distance and more slowly than the n-type implant. Therefore, a dopant such as In would be used in the example application instead of a heavier implant dopant such as B.)

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A VDMOS, comprising:
   an n-well formed within a semiconductor wafer;
   a drain coupled to said n-well of said VDMOS;
   a first source coupled to said n-well of said VDMOS;
   a second source coupled to said n-well;
   a gate coupled to said n-well, said gate having a gate dielectric and a gate electrode;
   a first p-body region and a second p-body region within said n-well, said first and second p-body regions including an $n^+$-type region and an n-type region; and
   a first channel region located under said gate electrode and within said first p-body region;
   a second channel region located under said gate electrode and within said second p-body region;
   wherein a width of said first and second channel regions of said VDMOS are located between an inner boundary of said first and second p-body regions and an outer boundary of said n-type region of said first and second p-body regions, and further wherein said width of said first and second channel regions is less than 80% of a distance between an outer boundary of said $n^+$-type region of said first and second p-body regions and said inner boundary of said first and second p-body regions at a surface of said first and second p-body regions located below said gate electrode.

2. The VDMOS of claim 1 wherein said n-type region of said first and second p-body regions contains As.

3. The VDMOS of claim 1 wherein said first and second p-body regions contain B.

* * * * *